United States Patent
Arai et al.

(10) Patent No.: US 11,388,032 B1
(45) Date of Patent: Jul. 12, 2022

(54) APPARATUSES AND METHODS FOR PRE-EMPHASIS CONTROL

(71) Applicant: MICRON TECHNOLOGY, INC., Boise, ID (US)

(72) Inventors: Tetsuya Arai, Sagamihara (JP); Chihoko Yokobe, Hachioji (JP); Guangcan Chen, Machida (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/152,660

(22) Filed: Jan. 19, 2021

(51) Int. Cl.
  *H03K 19/0175* (2006.01)
  *H04L 25/03* (2006.01)
  *H03K 19/017* (2006.01)

(52) U.S. Cl.
  CPC . *H04L 25/03834* (2013.01); *H03K 19/01742* (2013.01)

(58) Field of Classification Search
  CPC .............. H03K 19/01742; H04L 25/03834
  See application file for complete search history.

(56) References Cited

U.S. PATENT DOCUMENTS

| | | | | |
|---|---|---|---|---|
| 7,733,128 B2* | 6/2010 | Miura | ................ | H04L 25/0282 326/86 |
| 8,390,314 B2* | 3/2013 | Dang | ................ | H04L 25/03834 326/21 |
| 8,493,103 B2* | 7/2013 | Fukuda | ............... | H04L 25/0282 327/108 |
| 11,031,054 B1* | 6/2021 | Arai | ......................... | G11C 7/22 |
| 2004/0113656 A1* | 6/2004 | Sato | ..................... | H04L 25/0288 326/86 |
| 2007/0046332 A1* | 3/2007 | Tanaka | ................ | H04L 25/0272 326/83 |
| 2007/0057702 A1* | 3/2007 | Suenaga | .......... | H03K 19/09432 327/108 |
| 2007/0075745 A1* | 4/2007 | Song | ............. | H03K 19/017581 326/83 |
| 2008/0218222 A1* | 9/2008 | Nishi | .................. | H04L 25/0278 327/108 |
| 2009/0003463 A1* | 1/2009 | Muraoka | ............ | H03K 19/0005 375/257 |
| 2013/0033290 A1* | 2/2013 | King | .................... | H04L 25/0276 327/108 |
| 2013/0147532 A1* | 6/2013 | Song | ........................ | G11C 7/12 327/170 |

* cited by examiner

*Primary Examiner* — Kurtis R Bahr
(74) *Attorney, Agent, or Firm* — Dorsey & Whitney LLP

(57) ABSTRACT

Apparatuses and methods for pre-emphasis control are described. An example apparatus includes a pull-up circuit and a pull-down circuit. The pull-up circuit is configured to receive a pull-up data activation signal and drive a data terminal to a pull-up voltage responsive to an active pull-up data activation signal. The pull-down circuit is configured to receive a pull-down activation signal and drive a data terminal to a pull-down voltage responsive to an active pull-down data activation signal. The example apparatus further includes a pre-emphasis circuit that includes a pre-emphasis timing control circuit configured to provide a timing control signal, and further includes a logic circuit. A pre-emphasis control signal based on at least one of the pull-up and pull-down data activation signals is provided to control providing pre-emphasis having a timing based on a mode of operation.

21 Claims, 25 Drawing Sheets

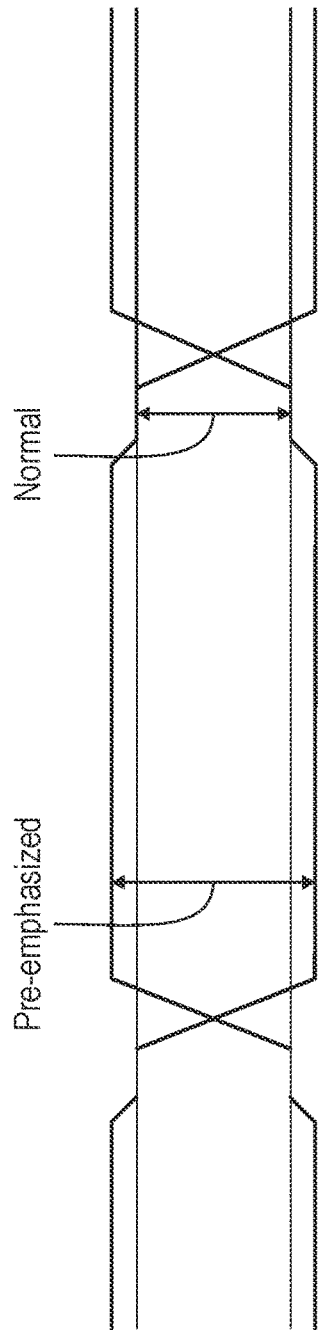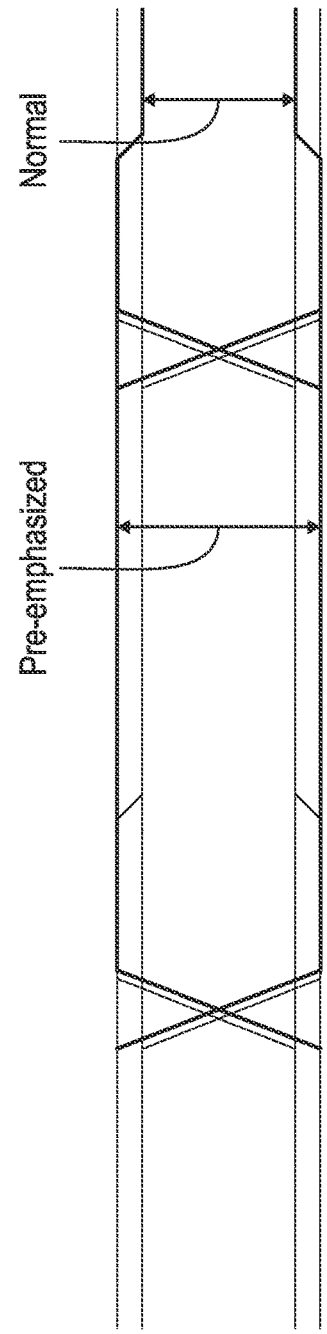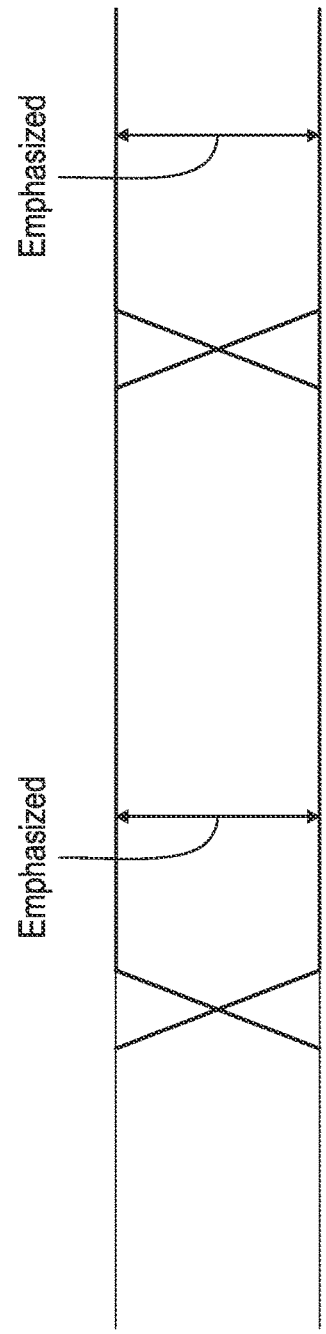

| FSP | Operating Frequency | Pre-emphasis | Cross Point |
|---|---|---|---|
| [0] | Low | Off | Shift Downward |
| [1] | High | Off | Default |
| [2] | Very High | Always | Default |

*FIG. 19A*

| FSP | Operating Frequency | Pre-emphasis | Cross Point |
|---|---|---|---|
| [0] | Low | Off | Shift Downward |
| [1] | High | Off | Default |
| [2] | Very High | Long | Shift Downward |

*FIG. 19B*

APPARATUSES AND METHODS FOR PRE-EMPHASIS CONTROL

BACKGROUND

Digital systems, such as memory devices, continue to operate at higher and higher speeds. Various signal lines that carry digital signals may exhibit low-pass filter (LPF) characteristics, either due to increasing channel loss with frequency, or through capacitive filtering. Thus, the maximum data rate supported by a channel becomes limited.

To compensate for LPF effects of a channel, various equalization techniques have been used. Typically, an equalizer circuit with a high pass frequency response may be provided. When a low pass channel is matched with a high pass equalizer, the overall frequency response may be flattened. One conventional approach to equalization includes modification of the shape of a transmitted signal such that the capacitance of the signal line causes the transmitted signal to be received with a desired shape, for example, by pre-emphasis. Pre-emphasis refers to increasing the amplitude of a digital signal by providing, at every bit transition, an overshoot that becomes filtered by the capacitive effects of the signal line.

The timing of applying pre-emphasis should be accurately controlled to pre-emphasize a digital signal successfully. Where the pre-emphasis is applied early, or late, or for an insufficient duration of time, the digital signal may be distorted unpredictably and/or the pre-emphasis is ineffective. Therefore, it would be desirable to have apparatuses and methods to control the timing of applying pre-emphasis to digital signals.

BRIEF DESCRIPTION OF THE DRAWINGS

FIGS. 16A, 16B, and 16C are signal diagrams of "data eyes" of output data signals for the modes of operation of FIGS. 14, 13, and 15.

FIG. 19A is a diagram of example settings for different modes of operation of a pre-emphasis timing control circuit for different frequency set points for a mode register according to an embodiment of the disclosure.

FIG. 19B is a diagram of example settings for different modes of operation of a pre-emphasis timing control circuit for different frequency set points for a mode register according to an embodiment of the disclosure.

DETAILED DESCRIPTION

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
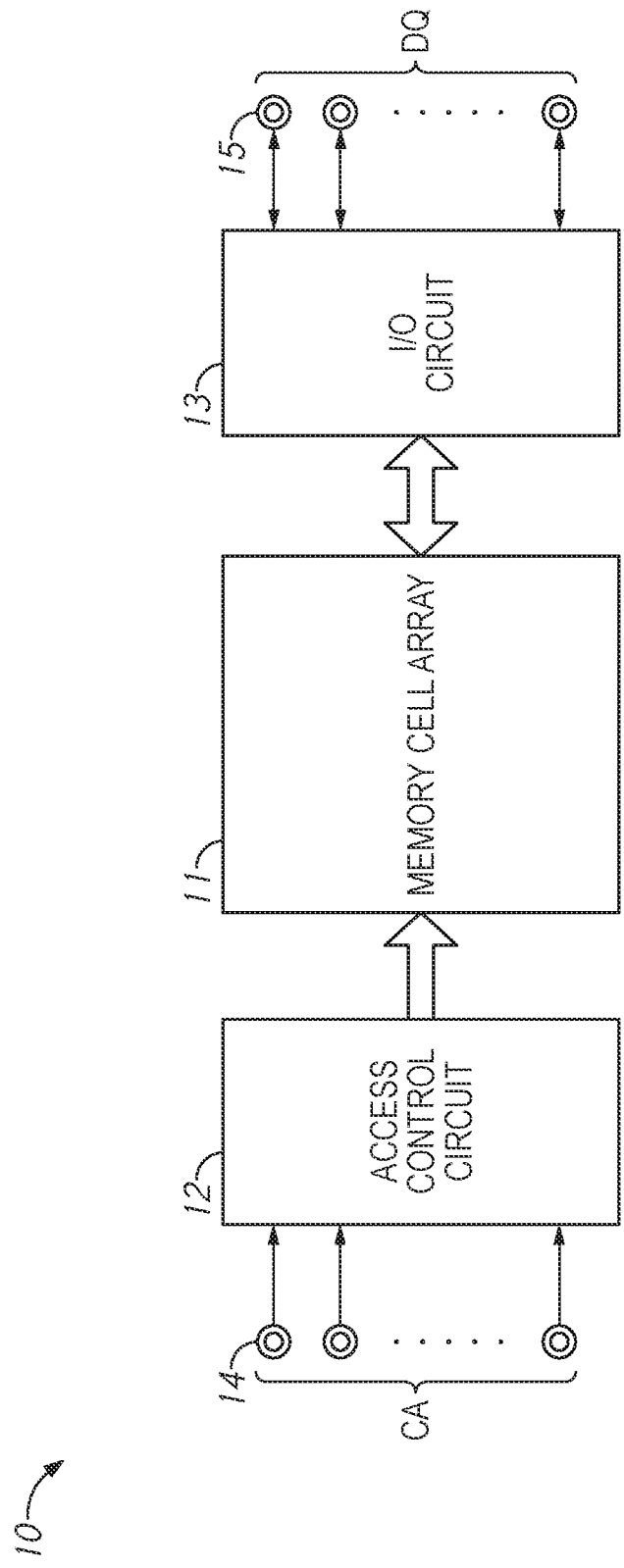
FIG. 1 is a block diagram showing a configuration of a semiconductor device according to an embodiment of the disclosure.

A semiconductor device 10 shown in FIG. 1 is an LPDDR5 (Low-Power Double Data Rate 5) DRAM, for example, and has a memory cell array 11, an access control circuit 12 that provides access to the memory cell array 11, and an I/O circuit 13 that inputs data to and outputs data from the memory cell array 11. The access control circuit 12 provides access to the memory cell array 11 based on a command address signal CA input from an external controller via a command address terminal 14. In a read operation, data DQ read out from the memory cell array 11 is output to a data terminals 15 via the I/O circuit 13. In a write operation, data DQ input to the data terminals 15 from the external controller is provided to the memory cell array 11 via the I/O circuit 13.

Figure 2:
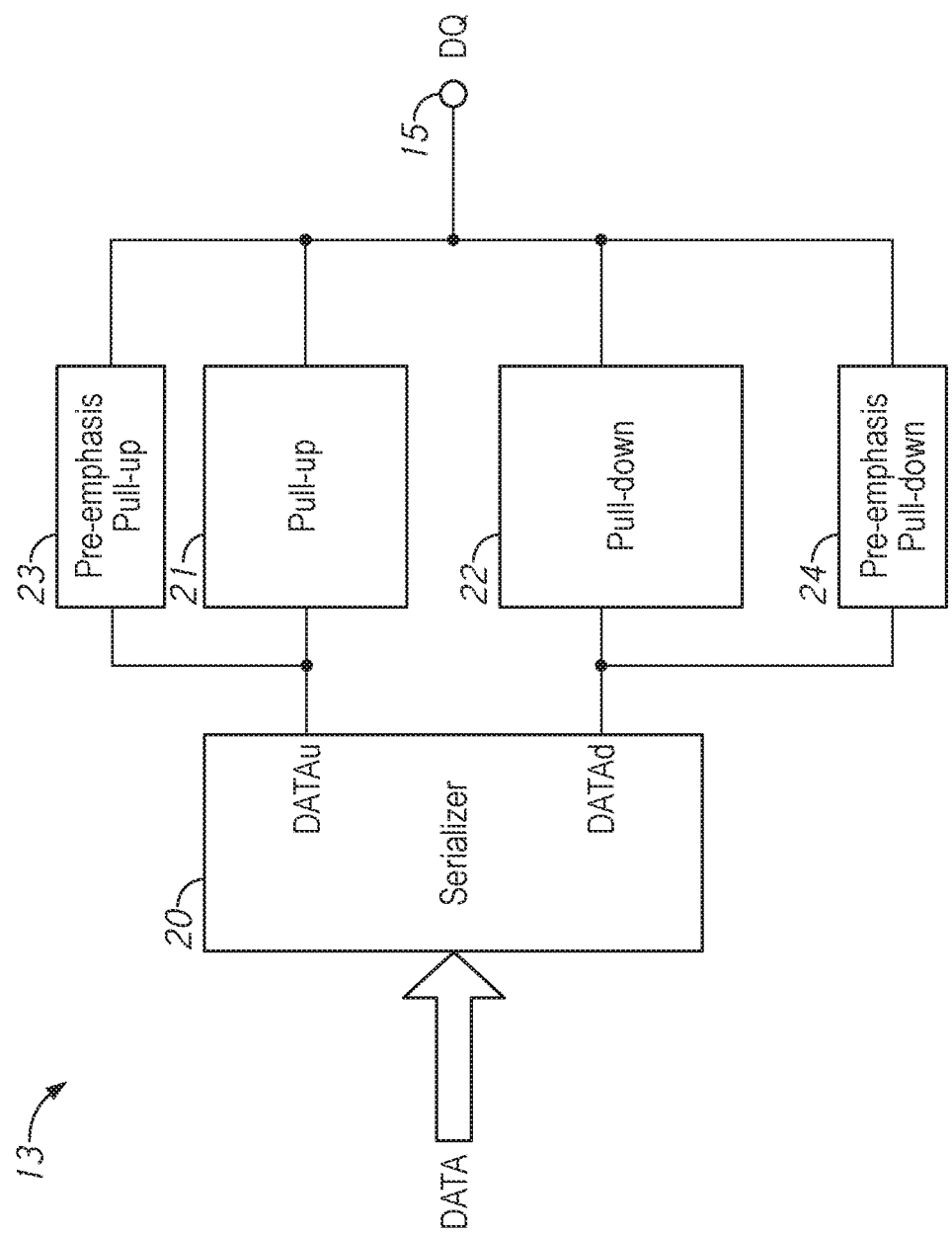
FIG. 2 is a block diagram showing a circuit of a data output system included in an I/O circuit.

FIG. 2 shows circuit blocks of a data output system included in the I/O circuit 13, which are associated with one data terminal 15. As shown in FIG. 2, the I/O circuit 13 includes a serializer 20 that converts parallel data DATA read out from the memory cell array 11 to serial data. The serial data output from the serializer 20 includes pull-up data DATAu and pull-down data DATAd. The pull-up data DATAu and the pull-down data DATAd are signals that may be complementary to each other.

Figure 3A:
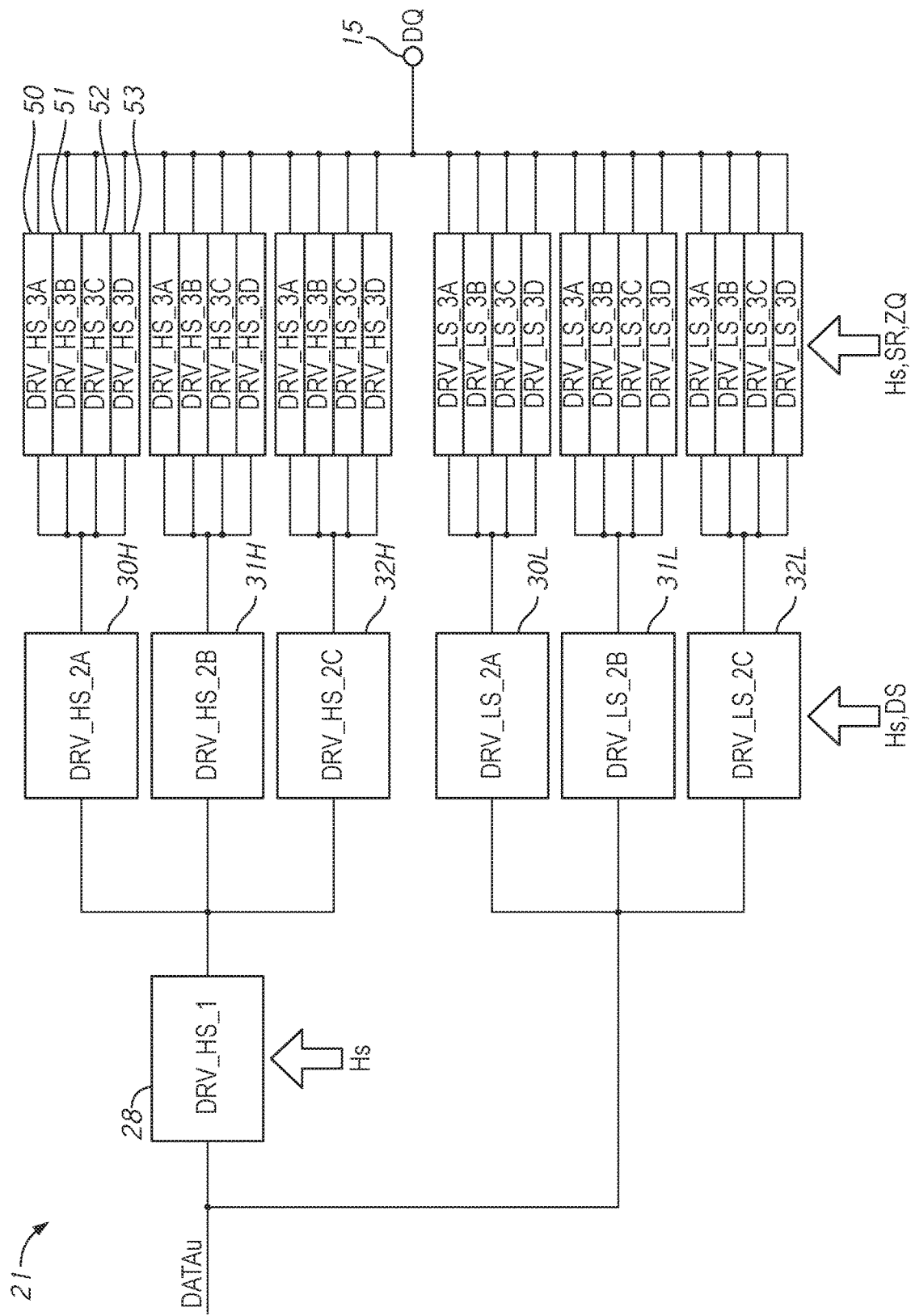
FIG. 3A is a block diagram showing a configuration of a pull-up circuit.

The pull-up data DATAu is provided to a pull-up circuit 21 and a pre-emphasis circuit 23. The pull-up circuit 21 is activated in a pull-up operation, that is, when high-level read data DQ is output from the data terminal 15. As shown in FIG. 3A, the pull-up circuit 21 includes three pull-up driver circuits 30H to 32H that belong to a high-speed path and three pull-up driver circuits 30L to 32L that belong to a low-speed path. Whether to use the high-speed path or the low-speed path is selected based on a speed mode signal Hs input to a driver circuit 28. In a case where the high-speed path is selected, one or two or more of the pull-up driver circuits 30H to 32H is/are selected based on a driver-strength selection signal DS. In a case where the low-speed path is selected, one or two or more of the pull-up driver circuits 30L to 32L is/are selected based on the driver-strength selection signal DS. The driver sizes of the pull-up driver circuits 30H to 32H may be different from one another. Similarly, the driver sizes of the pull-up driver circuits 30L to 32L may be different from one another.

Each of the pull-up driver circuits 30H to 32H and 30L and 32L is coupled to respective output impedance calibration circuits 50 to 53. These output impedance calibration circuits equally and selectively drive adjustment MOS transistors included in a plurality of output-stage circuits that have an equal impedance to one another based on an impedance selection signal ZQ in such a manner that an impedance per one output-stage circuit is calibrated to a desired value. The number of associated output-stage circuits is different among the pull-up driver circuits 30H/L to 32H/L. For example, the circuit 30H/L is associated with three output-stage circuits, the circuit 31H/L is associated with two output-stage circuits, and the circuit 32H/L is associated with one output-stage circuit. In this case, each of the output impedance calibration circuits 50 to 53 in the circuit 30H/L drives adjustment MOS transistors of three output-stage circuits, each of the output impedance calibration circuits 50 to 53 in the circuit 31H/L drives adjustment MOS transistors of two output-stage circuits, and each of the output impedance calibration circuits 50 to 53 in the circuit 32H/L drives an adjustment MOS transistor of one output-stage circuit. Therefore, it is possible to select an output impedance in a pull-up operation to be an accurate impedance with desired driver strength. In addition, the speed mode signal Hs and a slew-rate selection signal SR are also provided to the output impedance calibration circuits 50 to 53 in common.

Figure 3B:
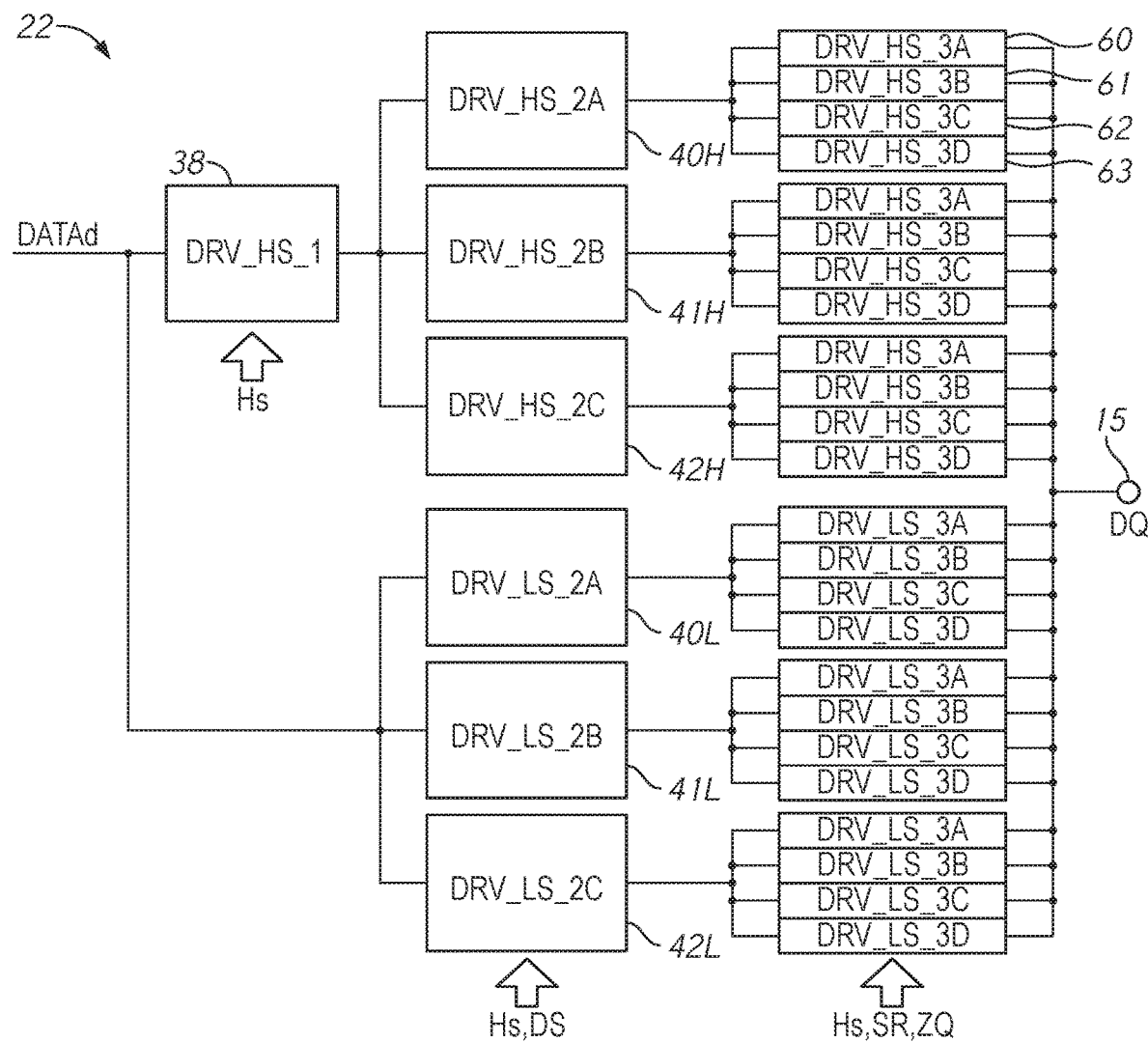
FIG. 3B is a block diagram showing a configuration of a pull-down circuit.

The pull-down data DATAd is provided to a pull-down circuit 22 and a pre-emphasis circuit 24. The pull-down circuit 22 is activated in a pull-down operation, that is, when low-level read data DQ is output from the data terminal 15. As shown in FIG. 3B, the pull-down circuit 22 includes three pull-down driver circuits 40H to 42H that belong to a high-speed path and three pull-down driver circuits 40L to 42L that belong to a low-speed path. Whether to use the high-speed path or the low-speed path is selected based on the speed mode signal Hs input to a driver circuit 38. In a case where the high-speed path is selected, one or two or more of the pull-down driver circuits 40H to 42H is/are selected based on the driver-strength selection signal DS. In a case where the low-speed path is selected, one or two or more of the pull-down driver circuits 40L to 42L is/are selected based on the driver-strength selection signal DS. The driver sizes of the pull-down driver circuits 40H to 42H may be different from one another. Similarly, the driver sizes of the pull-down driver circuits 40L to 42L may be different from one another.

Each of the pull-down driver circuits 40H to 42H and 40L and 42L is coupled to respective output impedance calibration circuits 60 to 63. These output impedance calibration circuits equally and selectively drive adjustment MOS transistors included in a plurality of output-stage circuits that have an equal impedance to one another based on the impedance selection signal ZQ in such a manner that an impedance per one output-stage circuit is calibrated to a desired value. The number of the associated output-stage circuits is different among the pull-down driver circuits 40H/L to 42H/L. For example, the circuit 40H/L is associated with three output-stage circuits, the circuit 41H/L is associated with two output-stage circuits, and the circuit 42H/L is associated with one output-stage circuit. In this case, each of the output impedance calibration circuits 60 to 63 in the circuit 40H/L drives adjustment MOS transistors of three output-stage circuits, each of the output impedance calibration circuits 60 to 63 in the circuit 41H/L drives adjustment MOS transistors of two output-stage circuits, and each of the output impedance calibration circuits 60 to 63 in the circuit 42H/L drives an adjustment MOS transistor of one output-stage circuit. Therefore, it is possible to select an output impedance in a pull-down operation to be an accurate impedance with desired driver strength. In addition, the speed mode signal Hs and the slew-rate selection signal SR are also provided to the output impedance calibration circuits 60 to 63 in common.

Each of the pre-emphasis circuits 23 and 24 temporarily lowers its output resistance only during a period of data transition, thereby compensating for loss by the skin effect and dielectric loss generated in a high-frequency operation. Therefore, it is possible to allow data transition to occur with an appropriate slew rate even in a high-frequency operation and to drive the data terminal 15 with a set resistance in a steady state.

Figure 4A:
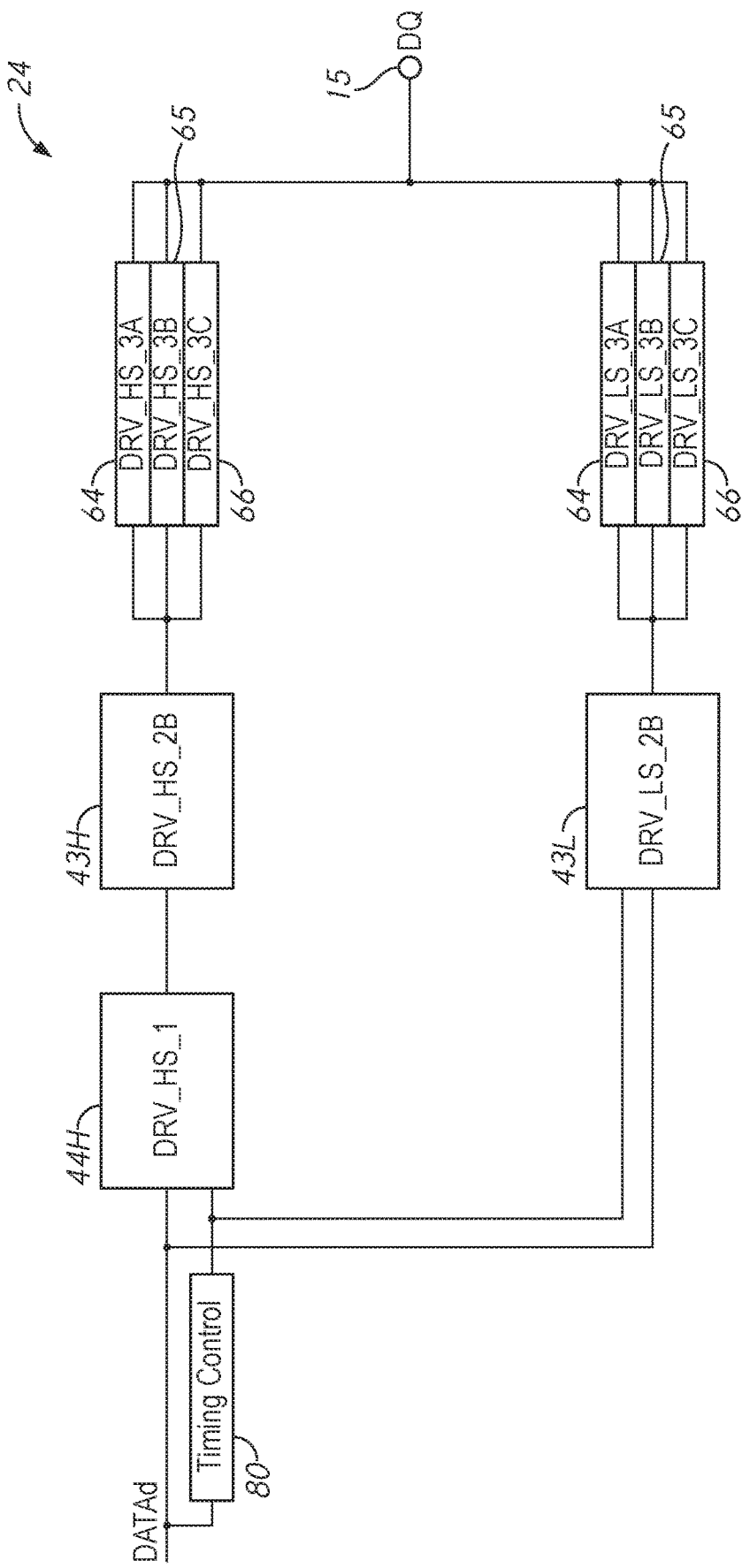
FIG. 4A is block diagram showing a configuration of a pull-down pre-emphasis circuit.

The pre-emphasis circuit 24 is activated when the read data DQ changes to a low level, thereby making a falling edge of the read data DQ steep. As shown in FIG. 4A, the pre-emphasis circuit 24 includes a pre-emphasis timing control circuit 80, pull-down driver circuits 43H and 44H that belong to a high-speed path, and a pull-down driver circuit 43L that belongs to a low-speed path. Each of the pull-down driver circuits 43H and 43L is coupled to respective three driver circuits 64 to 66 that are selected by a pre-emphasis operation start signal /PEmpStr.

Figure 4B:
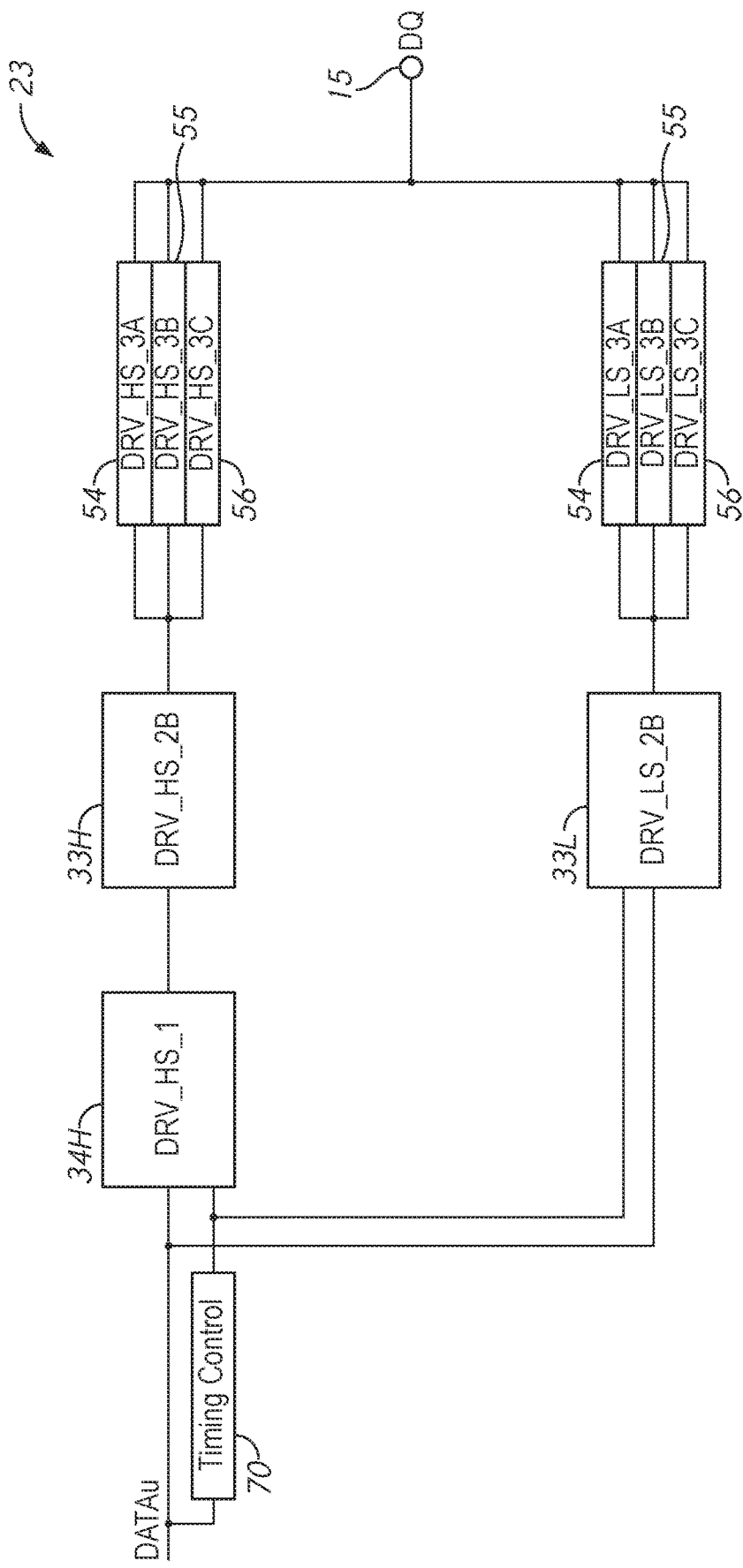
FIG. 4B is block diagram showing a configuration of a pull-up pre-emphasis circuit.

The pre-emphasis circuit 23 is activated when the read data DQ changes to a high level, thereby making a rising edge of the read data DQ steep. As shown in FIG. 4B, the pre-emphasis circuit 23 includes a pre-emphasis timing control circuit 70, pull-up driver circuits 33H and 34H that belong to a high-speed path, and a pull-up driver circuit 33L that belongs to a low-speed path. Each of the pull-up driver circuits 33H and 33L is coupled to respective three driver circuits 54 to 56 that are selected by the pre-emphasis operation start signal /PEmpStr.

While the example I/O circuit of FIG. 2 includes pre-emphasis circuit 23 and pre-emphasis circuit 24, in some embodiments of the disclosure an I/O circuit 13 includes one pre-emphasis circuit, for example, either a pull-up pre-emphasis circuit or a pull-down pre-emphasis circuit.

Figure 5:
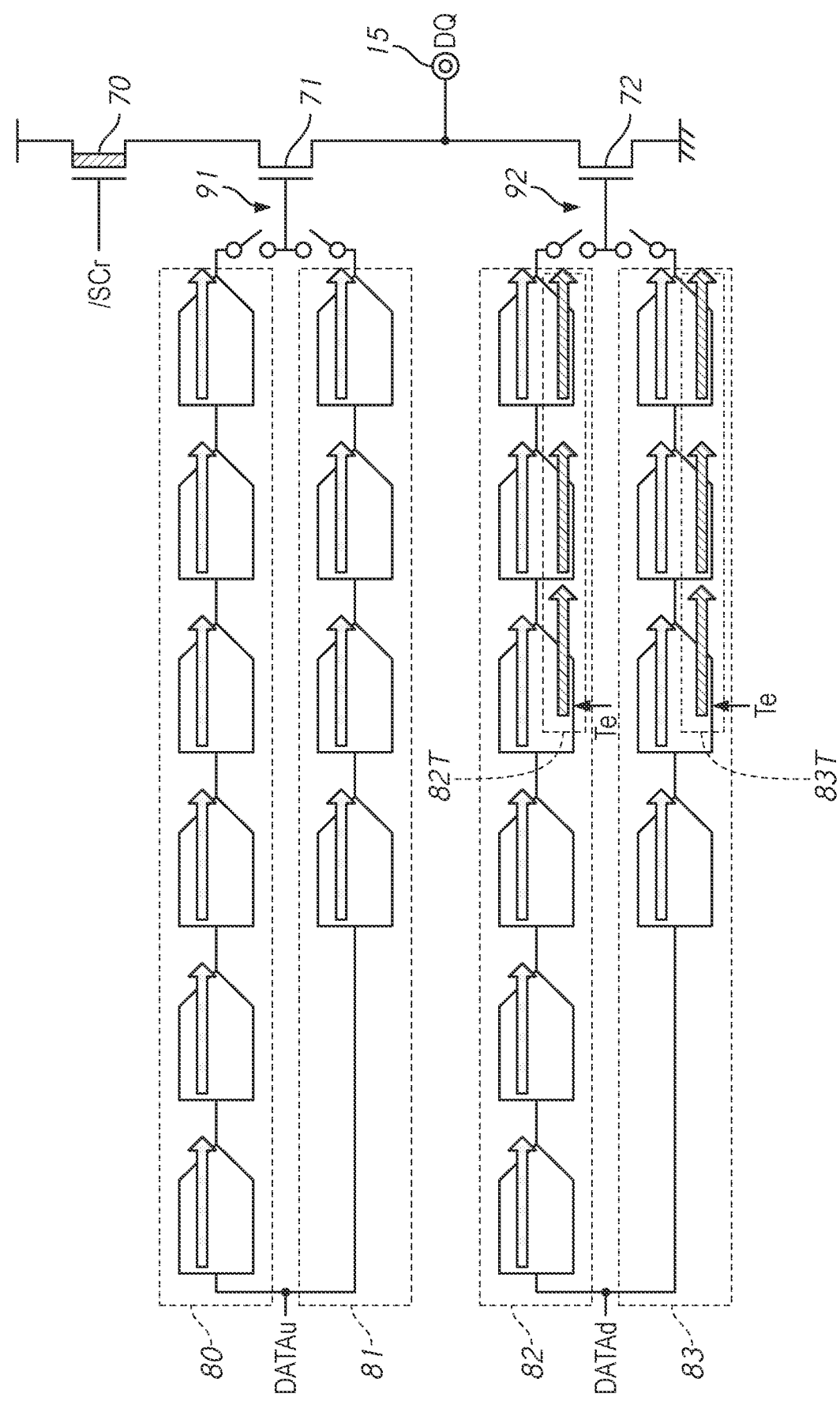
FIG. 5 is a schematic diagram for explaining flows of pull-up data and pull-down data.

FIG. 5 is a schematic diagram for explaining flows of the pull-up data DATAu and the pull-down data DATAd. As shown in FIG. 5, the pull-up data DATAu is provided to a gate electrode of an output transistor 71 via a high-speed path 80 or a low-speed path 81. The high-speed path 80 is smaller than the low-speed path 81 in fan out. The output transistor 71 is an N-channel MOS transistor. Whether to use the high-speed path 80 or the low-speed path 81 is selected based on a speed mode signal. Outputs of the high-speed path 80 and the low-speed path 81 are provided to the gate electrode of the output transistor 71 via a multiplexer 91. The pull-down data DATAd is provided to a gate electrode of an output transistor 72 via a high-speed path 82 or a low-speed path 83. The high-speed path 82 is smaller than the low-speed path 83 in fan out. The output transistor 72 is an N-channel MOS transistor. Whether to use the high-speed path 82 or the low-speed path 83 is selected based on the speed mode signal. Outputs of the high-speed path 82 and the low-speed path 83 are provided to the gate electrode of the output transistor 72 via a multiplexer 92. As shown in FIG. 5, both the high-speed paths 80 and 82 include gate circuits arranged in six stages, whereas both the low-speed paths 81 and 83 include gate circuits arranged in four stages.

In a case where the speed mode signal indicates a high-speed mode, the high-speed paths 80 and 82 are activated in a read operation and an ODT path 82T in the high-speed path 82 is activated in a target ODT operation. On the other hand, in a case where the speed mode signal indicates a low-speed mode, the low-speed paths 81 and 83 are activated in a read operation and an ODT path 83T in the low-speed path 83 is activated in a target ODT operation. The target ODT paths 82T and 83T are selected when a target ODT enable signal Te is activated. The target ODT enable signal Te is activated in a write operation. When the target ODT enable signal Te is activated, the pull-up side paths 80 and 81 and a portion of the pull-down side paths 82 and 83 other than the target ODT paths 82T and 83T are inactive.

A switching transistor 70, the output transistor 71, and the output transistor 72 are connected in series to one another between a high-potential side power line and a low-potential side power line. The switching transistor 70 is an N-channel MOS transistor in which a gate insulating film is formed to be thick, and a control signal /SCr is provided to a gate electrode thereof. The control signal /SCr is an inverted signal of a control signal SCr that becomes low in a read operation. The data terminal 15 is connected to a connecting point between the output transistor 71 and the output transistor 72. In FIG. 5 and the subsequent drawings, a transistor in which a straight line opposed to its gate electrode is denoted with a bold line is a transistor in which its gate insulating film is formed to be thick.

Figure 6A:
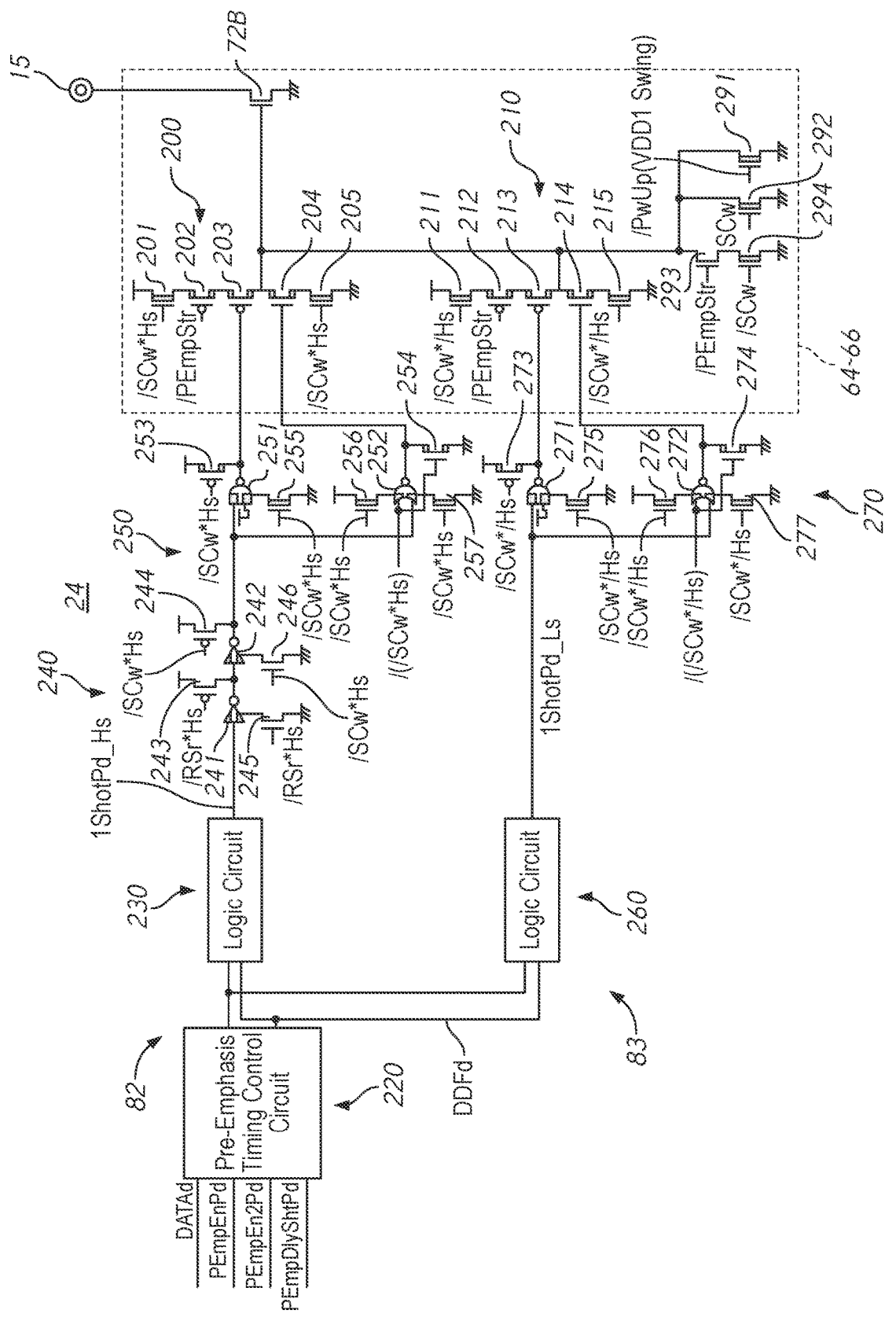
FIG. 6A is a circuit diagram showing a signal path in the pull-down circuit in more detail.

FIG. 6A is a circuit diagram of the pre-emphasis circuit 24. The pre-emphasis circuit 24 includes two tristate buffer circuits 200 and 210. Output nodes of the tristate buffer circuits 200 and 210 are connected to a gate electrode of an output transistor 72B in common. That is, the output nodes of the tristate buffer circuits 200 and 210 are connected in wired OR connection and configure the multiplexer 92 shown in FIG. 5. The output transistor 72B is one of the output transistors 72 shown in FIG. 5, which is included in the pre-emphasis circuit 24.

The tristate buffer circuit 200 belongs to the high-speed path 82 and includes transistors 201 to 205 that are connected in series to one another between a high-potential side power line and a low-potential side power line. The transistors 201 and 205 are N-channel MOS transistors, each of which has a gate insulating film formed to be thick, and the control signal /SCw*Hs is provided to gate electrodes thereof. A pre-emphasis operation start signal /PEmpStr is input to a gate electrode of the transistor 202. The transistor 203 is a P-channel MOS transistor that receives an output of a NAND gate circuit 251 included in a logic circuit 250 in a preceding stage. The transistor 204 is an N-channel MOS transistor that receives an output of a NOR gate circuit 252 included in the logic circuit 250 in the preceding stage. The transistors 202 to 204 respectively have a lowered threshold, and therefore can perform high-speed switching.

The pull-down data DATAd is provided to a pre-emphasis timing control circuit 220. The pre-emphasis timing control circuit 220 also receives a pull-down pre-emphasis enable signal PEmpEnPd. The pre-emphasis timing control circuit 220 also receives control signals PEmpDlyShtPd and PEmpEn2Pd. The combination of the pull-down pre-emphasis enable signal PEmpEnPd, and the control signals PEmpDlyShtPd and PEmpEn2Pd set modes of operation for the pre-emphasis timing control circuit 220 to provide a timing control signal DDFd to control activation and deactivation of pre-emphasis operations for the pull-down data DATAd.

The timing control signal DDFd and the pull-down data DATAd are input to the tristate buffer circuit 200 via logic circuits 230 and 240 and the logic circuit 250 included in the high-speed path 82. The logic circuit 230 receives the timing control signal DDFd and the pull-down data DATAd, and provides a pre-emphasis control signal 1ShotPd_Hs based on the timing control signal DDFd and the pull-down data DATAd. The pre-emphasis control signal 1ShotPd_Hs is provided to the logic circuit 240. The logic circuit 240 includes inverter circuits 241 and 242 connected to each other in cascade connection, transistors 243 and 244 that reset the high-speed path 82, and transistors 245 and 246 that activate the inverter circuits 241 and 242. The control signal /RSr*Hs is provided to gate electrodes of the transistors 243 and 245. The control signal /SCw*Hs is provided to gate electrodes of the transistors 244 and 246.

The logic circuit 250 includes the NAND gate circuit 251, the NOR gate circuit 252, a transistor 253 that fixes a gate electrode of the transistor 203 at a high level, a transistor 254 that fixes a gate electrode of the transistor 204 at a low level, a transistor 255 that activates the NAND gate circuit 251, and transistors 256 and 257 that activate the NOR gate circuit 252. An output signal of the logic circuit 240 and a high-level fixed signal are input to the NAND gate circuit 251. The output signal of the logic circuit 240 and the control signal /(/SCw*Hs) are input to the NOR gate circuit 252. The control signal /SCw*Hs is provided to gate electrodes of the transistors 253 and 255 to 257. The inverted signal /(/SCw*Hs) of the control signal /SCw*Hs is provided to a gate electrode of the transistor 254.

With this configuration, in a case where the speed mode signal Hs indicates a high-speed mode, the transistor 203 is temporarily turned on when the pull-down data DATAd changes to a high-level in a read operation. Therefore, the output transistor 72B is temporarily turned on, so that a pre-emphasis operation in a pull-down state is performed. On the other hand, in a case where the speed mode signal Hs indicates a low-speed mode, the output node of the tristate buffer circuit 200 is placed in a high-impedance state.

The tristate buffer circuit 210 belongs to the low-speed path 83 and includes transistors 211 to 215 that are connected in series to one another between a high-potential side power line and a low-potential side power line. The tristate buffer circuit 210 have the same circuit configuration as the tristate buffer circuit 200. The same signals as those input to the gate electrodes of the transistors 201, 202, and 205 are input to gate electrodes of the transistors 211, 212, and 215, except that the speed mode signal HS is inverted.

The timing control signal DDFd and the pull-down data DATAd are input to the tristate buffer circuit 210 via logic circuits 260 and 270 included in the low-speed path 83. The logic circuit 260 receives the timing control signal DDFd and the pull-down data DATAd, and provides a pre-emphasis control signal 1ShotPd_Ls based on the timing control signal DDFd and the pull-down data DATAd. The pre-emphasis control signal 1ShotPd_Ls is provided to the logic circuit 270. The logic circuit 270 includes a NAND gate circuit 271, a NOR gate circuit 272, a transistor 273 that fixes a gate electrode of the transistor 213 at a high level, a transistor 274 that fixes a gate electrode of the transistor 214 at a low level, a transistor 275 that activates the NAND gate circuit 271, and transistors 276 and 277 that activate the NOR gate circuit 272. The pre-emphasis control signal 1ShotPd_Ls of the logic circuit 260 and a high-level fixed signal are input to the NAND gate circuit 271. The pre-emphasis control signal 1ShotPd_Ls of the logic circuit 260 and a control signal /(/SCw*/Hs) are input to the NOR gate circuit 272. The control signal /SCw*/Hs is provided to gate electrodes of the transistors 273 and 275 to 277. The inverted signal /(/SCw*/Hs) of the control signal /SCw*/Hs is provided to a gate electrode of the transistor 274.

With this configuration, in a case where the speed mode signal Hs indicates a low-speed mode, the transistor 213 is temporarily turned on when the pull-down data DATAd changes to a high-level in a read operation. Therefore, the output transistor 72B is temporarily turned on, so that a pre-emphasis operation in a pull-down state is performed. On the other hand, in a case where the speed mode signal Hs indicates a high-speed mode, the output node of the tristate buffer circuit 210 is placed in a high-impedance state.

Further, the pre-emphasis circuit 24 includes N-channel MOS transistors 291 to 294 that reset the gate electrode of the output transistor 72B to a low level. The control signals /PwUp, SCw, and /PEmpStr and a control signal /SCw are provided to gate electrodes of the transistors 291 to 294, respectively. The transistors 291, 292, and 294 are N-channel MOS transistors, each of which has a gate insulating film formed to be thick. Further, the amplitude of the control signal /PwUp input to the transistor 291 is not the boosted potential VCCP but the external power potential VDD1. Meanwhile, the amplitudes of the control signals SCw and /SCw are VCCP, and the amplitude of the control signal /PEmpStr is VDD2.

In the pre-emphasis circuit 24, the driver circuits 64 to 66 are provided in parallel.

Figure 6B:
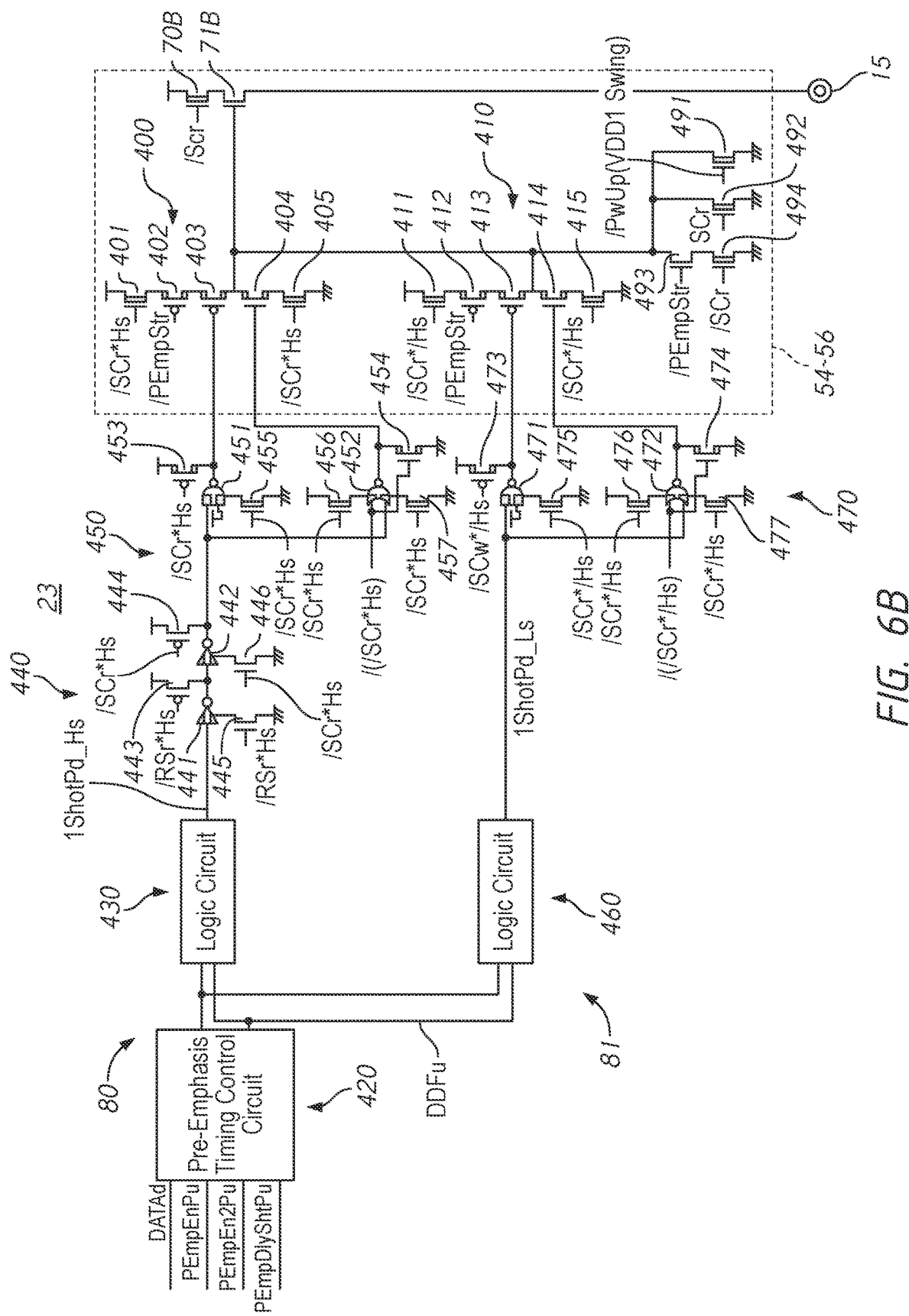
FIG. 6B is a circuit diagram showing a signal path in the pull-up circuit in more detail.

FIG. 6B is a circuit diagram of the pre-emphasis circuit 23. The pre-emphasis circuit 23 includes two tristate buffer circuits 400 and 410. Output nodes of the tristate buffer circuits 400 and 410 are connected to a gate electrode of an output transistor 71B in common. That is, the output nodes of the tristate buffer circuits 400 and 410 are connected in wired OR connection and configure the multiplexer 91 shown in FIG. 5. The output transistor 71B is one of the output transistors 71 shown in FIG. 5, which is included in the pre-emphasis circuit 23.

The tristate buffer circuit 400 belongs to the high-speed path 80 and includes transistors 401 to 405 that are connected in series to one another between a high-potential side power line and a low-potential side power line. The transistors 401 and 405 are N-channel MOS transistors, each of which has a gate insulating film formed to be thick, and the control signal /SCr*Hs is provided to gate electrodes thereof. The pre-emphasis operation start signal /PEmpStr is input to a gate electrode of the transistor 402. The transistor 403 is a P-channel MOS transistor that receives an output of a NAND gate circuit 451 included in a logic circuit 450 in a preceding stage. The transistor 404 is an N-channel MOS transistor that receives an output of a NOR gate circuit 452 included in the logic circuit 450 in the preceding stage. The transistors 402 to 404 respectively have a lowered threshold voltage, and therefore can perform high-speed switching.

The pull-up data DATAu is provided to a pre-emphasis timing control circuit 420. The pre-emphasis timing control circuit 420 also receives a pull-up pre-emphasis enable signal PEmpEnPu. The pre-emphasis timing control circuit 220 also receives control signals PEmpDlyShtPu and PEmpEn2Pu. The combination of the pull-up pre-emphasis enable signal PEmpEnPu, and the control signals PEmpDlyShtPu and PEmpEn2Pu set modes of operation for the pre-emphasis timing control circuit 420 to provide a timing control signal DDFu to control activation and deactivation of pre-emphasis operations for the pull-up data DATAu.

The timing control signal DDFu and the pull-up data DATAu are input to the tristate buffer circuit 400 via logic circuits 430 and 440 and the logic circuit 450 that are included in the high-speed path 80. The logic circuit 430 receives the timing control signal DDFu and the pull-up data DATAu, and provides a pre-emphasis control signal 1ShotPu_Hs based on the timing control signal DDFu and the pull-up data DATAu. The pre-emphasis control signal 1ShotPu_Hs is provided to the logic circuit 440. The logic circuit 440 includes inverter circuits 441 and 442 connected to each other in cascade connection, transistors 443 and 444 that reset the high-speed path 80, and transistors 445 and 446 that activate the inverter circuits 441 and 442. The control signal /RSr*Hs is provided to gate electrodes of the transistors 443 and 445. The control signal /SCr*Hs is provided to gate electrodes of the transistors 444 and 446.

The logic circuit 450 includes the NAND gate circuit 451, the NOR gate circuit 452, a transistor 453 that fixes a gate electrode of the transistor 403 at a high level, a transistor 454 that fixes a gate electrode of the transistor 404 at a low level, a transistor 455 that activates the NAND gate circuit 451, and transistors 456 and 457 that activate the NOR gate circuit 452. An output signal of the logic circuit 440 and a high-level fixed signal are input to the NAND gate circuit 451. The output signal of the logic circuit 440 and the control signal /(/SCr*Hs) are input to the NOR gate circuit 452. The control signal /SCr*Hs is provided to gate electrodes of the transistors 453 and 455 to 457. The inverted signal /(/SCr*Hs) of the control signal /SCr*Hs is provided to a gate electrode of the transistor 454. The power potential VDD2 lower than the boosted potential VCCP is used for the control signal /SCr*Hs used in the logic circuits 430 and 440, whereas the boosted potential VCCP is used for the control signal /SCr*/Hs used in the logic circuit 450 and subsequent circuits for driving a thick film transistor.

With this configuration, in a case where the speed mode signal Hs indicates a high-speed mode, the transistor 403 is temporarily turned on when the pull-up data DATAu changes to a high-level in a read operation. Therefore, the output transistor 71B is temporarily turned on, so that a pre-emphasis operation in a pull-up state is performed. On the other hand, in a case where the speed mode signal Hs indicates a low-speed mode, the output node of the tristate buffer circuit 400 is placed in a high-impedance state.

The tristate buffer circuit 410 belongs to the low-speed path 81 and includes transistors 411 to 415 that are connected in series to one another between a high-potential side power line and a low-potential side power line. The tristate buffer circuit 410 have the same circuit configuration as the tristate buffer circuit 400. The same signals as those input to the gate electrodes of the transistors 401, 402, and 405 are input to gate electrodes of the transistors 411, 412, and 415, except that the speed mode signal Hs is inverted.

The timing control signal DDFu and the pull-up data DATAu are input to the tristate buffer circuit 410 via logic circuits 460 and 470 included in the low-speed path 81. The logic circuit 460 receives the timing control signal DDFu and the pull-up data DATAu, and provides a pre-emphasis control signal 1ShotPu_Ls based on the timing control signal DDFu and the pull-up data DATAu. The pre-emphasis control signal 1ShotPu_Ls is provided to the logic circuit 470. The logic circuit 470 includes a NAND gate circuit 471, a NOR gate circuit 472, a transistor 473 that fixes a gate electrode of the transistor 413 at a high level, a transistor 474 that fixes a gate electrode of the transistor 414 at a low level, a transistor 475 that activates the NAND gate circuit 471, and transistors 476 and 477 that activate the NOR gate circuit 472. The pre-emphasis control signal 1ShotPu_Ls of the logic circuit 460 and a high-level fixed signal are input to the NAND gate circuit 471. The pre-emphasis control signal 1ShotPu_Ls of the logic circuit 460 and the control signal /(/SCr*/Hs) are input to the NOR gate circuit 472. The control signal /SCr*/Hs is provided to gate electrodes of the transistors 473 and 475 to 477. The inverted signal /(/SCr*/Hs) of the control signal /SCr*/Hs is provided to a gate electrode of the transistor 474.

With this configuration, in a case where the speed mode signal Hs indicates a low-speed mode, the transistor 413 is temporarily turned on when the pull-up data DATAu changes to a high-level in a read operation. Therefore, the output transistor 71B is temporarily turned on, so that a pre-emphasis operation in a pull-up state is performed. On the other hand, in a case where the speed mode signal Hs indicates a high-speed mode, the output node of the tristate buffer circuit 410 is placed in a high-impedance state.

Further, the pre-emphasis circuit 23 includes N-channel MOS transistors 491 to 494 that reset the gate electrode of the output transistor 71B to a low level. The control signals /PwUp, SCr, /PEmpStr, and /SCr are provided to gate electrodes of the transistors 491 to 494, respectively. The transistors 491, 492, and 494 are N-channel MOS transistors, each of which has a gate insulating film formed to be thick. Further, the amplitude of the control signal /PwUp input to the transistor 491 is not the boosted potential VCCP but the external power potential VDD1. Meanwhile, the amplitudes of the control signals SCr, /PEmpStr, and/SCr are VCCP.

Figure 7:
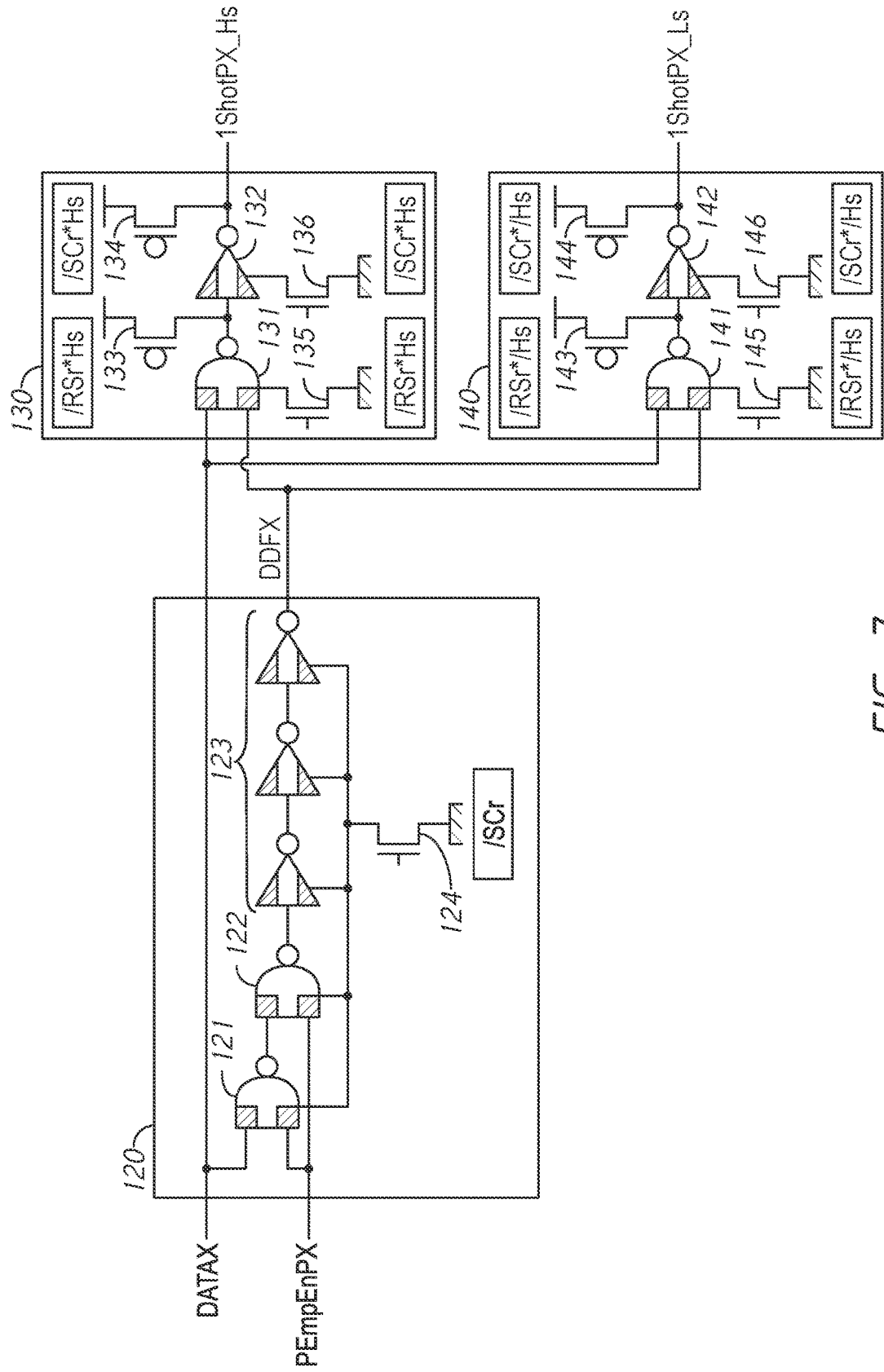
FIG. 7 is a schematic diagram of a pre-emphasis timing control circuit and logic circuits.

FIG. 7 is a schematic diagram of a pre-emphasis timing control circuit 120 and logic circuits 130 and 140. The pre-emphasis timing control circuit 120 may be used for controlling the timing of providing pre-emphasis by a pre-emphasis circuit. The logic circuits 130 and 140 provide respective pre-emphasis control signals 1shotPX_Hs and 1shotPX_Ls having a timing as controlled by the pre-emphasis timing control circuit 120. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data.

The pre-emphasis timing control circuit 120 includes a NAND gate circuit 121 that receives data activation signal DATAX and a pre-emphasis enable signal PEmpEnPX, a NAND gate circuit 122 that receives an output signal of the NAND gate circuit 121 and the pre-emphasis enable signal PEmpEnPX, inverter circuits 123 that are connected in cascade connection as a subsequent stage of the NAND gate circuit 122, where the number of the inverter circuits 123 being an odd number, and an N-channel MOS transistor 124 that provides power to the NAND gate circuits 121 and 122 and the inverter circuits 123. A control signal /SCr is provided to a gate electrode of the transistor 124. The pre-emphasis enable signal PEmpEnPX selects whether to perform a pre-emphasis operation at a transition of the read data DQ. Therefore, in a case where the pre-emphasis enable signal PEmpEnPX is active at a high level, a timing control signal DDFX is generated from the pre-emphasis timing control circuit 120 based on the data activation signal DATAX.

The logic circuit 130 may be included in a high-speed path for data. The logic circuit 130 includes a NAND gate circuit 131 that receives the timing control signal DDFX and the data activation signal DATAX, an inverter circuit 132, transistors 133 and 134 that reset the high-speed path, and transistors 135 and 136 that activate the NAND gate circuit 131 and the inverter circuit 132. A control signal /RSr*Hs is provided to gate electrodes of the transistors 133 and 135. A control signal /SCr*Hs is provided to gate electrodes of the transistors 134 and 136.

The logic circuit 140 may be included in a low-speed path for data. The logic circuit 140 includes a NAND gate circuit 141 that receives the timing control signal DDFX and the data activation signal DATAX, an inverter circuit 142, transistors 143 and 144 that reset the low-speed path, and transistors 145 and 146 that activate the NAND gate circuit 141 and the inverter circuit 142. The control signal /RSr*/Hs is provided to gate electrodes of the transistors 143 and 145. The control signal /SCr*/Hs is provided to gate electrodes of the transistors 144 and 146.

A pull-up data path may include respective pre-emphasis timing control circuit 120 and logic circuits 130 and 140 and a pull-down data path may also include respective pre-emphasis timing control circuit 120 and logic circuits 130 and 140.

Figure 8:
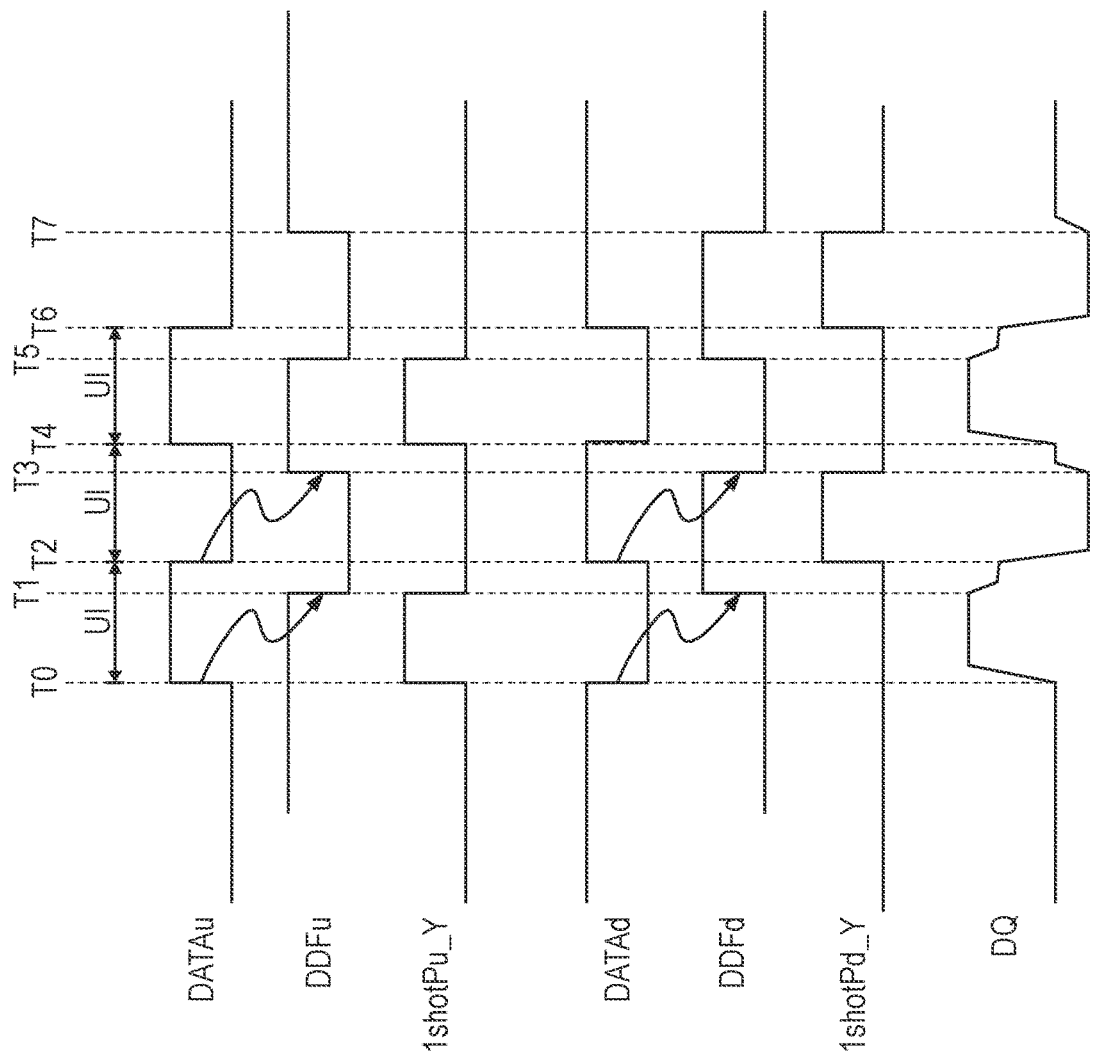
FIG. 8 is a timing diagram of various signals during operation of the pre-emphasis timing control circuit and logic circuits of FIG. 7.

Operation of the pre-emphasis timing control circuit 120 and logic circuits 130 and 140 will be described with reference to FIG. 8. FIG. 8 is a timing diagram of various signals during operation of the pre-emphasis timing control circuit 120 and logic circuits 130 and 140 of FIG. 7. FIG. 8 illustrates pull-up and pull-down data activation signals DATAu and DATAd for three unit intervals UI (e.g., three bits of data, 1, 0, and 1), timing control signals DDFu and DDFd, and pre-emphasis control signals 1shotPu_Y and 1shotPd_Y. The pull-up data activation signals DATAu, timing control signal DDFu, and pre-emphasis control signal 1shotPu_Y are related to a pull-up data path, and the pull-down data activation signals DATAd, timing control signal DDFd, and pre-emphasis control signal 1shotPd_Y are related to a pull-down data path. An output data signal DQ is also illustrated to show the effect of the pre-emphasis operation resulting from the pull-up and pull-down data activation signals DATAu and DATAd.

At time T0, the pull-up data activation signal DATAu changes to a high logic level (and the pull-down data activation signal DATAd changes to a low logic level). As a result, the pre-emphasis control signal 1shotPu_Y changes to a high logic level, and the output data signal DQ is driven to a high logic level with pre-emphasis, which is a pre-emphasis high logic voltage (e.g., a pumped high voltage) during pre-emphasis. At time T1 the timing control signal DDFu changes to a low logic level based on the rising edge of the pull-up data activation signal DATAu and the timing control signal DDFd changes to a high logic level based on the falling edge of the pull-down data activation signal DATAd. The low logic level timing control signal DDFu causes the pre-emphasis control signal 1shotPu_Y to change to a low logic level. As a result, a pre-emphasis is no longer applied for the output data signal DQ, and the output data signal changes from a pre-emphasis high logic voltage to nominal high logic level voltage.

At time T2, the pull-up data activation signal DATAu changes to a low logic level (and the pull-down data activation signal DATAd changes to a high logic level). As a result, the pre-emphasis control signal 1shotPd_Y changes to a high logic level, and the output data signal DQ is driven to a low logic level with pre-emphasis, which is a pre-emphasis low logic voltage (e.g., a pumped low voltage) during pre-emphasis. At time T3 the timing control signal DDFd changes to a low logic level based on the rising edge of the pull-down data activation signal DATAd and the timing control signal DDFu changes to a high logic level based on the falling edge of the pull-up data activation signal DATAu. The low logic level timing control signal DDFd causes the pre-emphasis control signal 1shotPd_Y to change to a low logic level. As a result, a pre-emphasis is no longer applied for the output data signal DQ, and the output data signal changes from a pre-emphasis low logic voltage to nominal low logic level voltage.

At time T4, the pull-up data activation signal DATAu again changes to a high logic level (and the pull-down data activation signal DATAd changes to a low logic level). The timing control signals DDFu and DDFd, and the pre-emphasis control signal 1shotPu_Y change as previously described between times T0 and T1. As a result, the pre-emphasis is also applied as previously described between times T0 and T1. Similarly, at time T6, the pull-up data activation signal DATAu again changes to a low logic level (and the pull-down activation data signal DATAd changes to a high logic level). The timing control signals DDFu and DDFd, and the pre-emphasis control signal 1shotPd_Y change as previously described between times T2 and T3. As a result, the pre-emphasis is also applied as previously described between times T2 and T3.

As shown by the example operation of FIG. 8, pre-emphasis is applied for a portion of a UI when the pull-up (and pull-down) data activation signals DATAu and DATAd change logic levels, indicating the output data signal DQ is to change.

If a pre-emphasis operation is not complete by a next pre-emphasis operation (e.g., DDFX does not timely change to a high logic level), the next pre-emphasis operation may not be executed normally. As a result, pre-emphasis timing control circuits (e.g., pre-emphasis timing control circuit 120 of FIG. 7) are designed to provide sufficient timing margin to complete a current pre-emphasis operation before a next pre-emphasis operation. However, when one unit interval (1 UI) is relatively short, such as when a system clock frequency is relatively high, the timing of the resulting pre-emphasis operation as controlled by the pre-emphasis timing control circuit may not be sufficient to provide adequate signal pre-emphasis.

Figure 9:
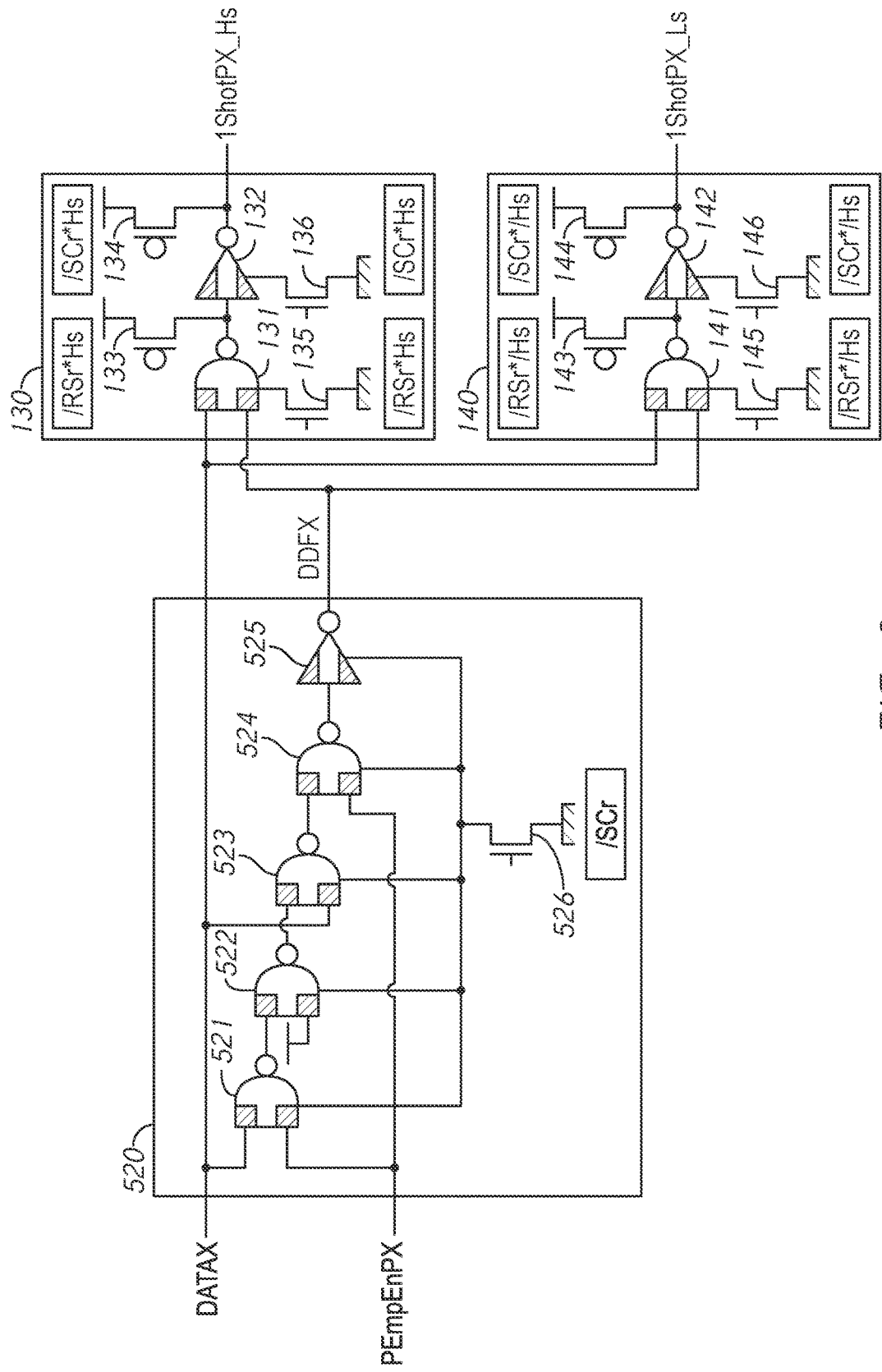
FIG. 9 is a block diagram of a pre-emphasis timing control circuit and logic circuits.

FIG. 9 is a block diagram of a pre-emphasis timing control circuit 520, and logic circuits 130 and 140. The pre-emphasis timing control circuit 520 provides timing control signal DDFX to control a pre-emphasis operation to activate pre-emphasis for a data level longer than 1 UI when the same data is provided for more than 1 UI, but deactivate the pre-emphasis for the data level at 1 UI when the data switches, or the when the tristate buffer changes to a high-impedance state. As previously described, the logic circuits 130 and 140 provide respective pre-emphasis control signals 1shotPX_Hs and 1shotPX_Ls having a timing as controlled by the pre-emphasis timing control circuit 520. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data.

The pre-emphasis timing control circuit 520 includes NAND gate circuits 521-524 and inverter circuit 525. The NAND gate circuit 521 receives data activation signal DATAX and a pre-emphasis enable signal PEmpEnPX and provides an output signal to a first input of the NAND gate circuit 522, which also receives a high logic level voltage at a second input. The NAND gate circuit 523 receives the data activation signal DATAX and an output signal of the NAND gate circuit 522, and provides an output signal to the NAND gate 524, which also receives the pre-emphasis enable signal PEmpEnPX. The NAND gate circuit 524 provides an output signal to the inverter 525, which provides the timing control signal DDFX. A transistor 526 provides power to the NAND gate circuits 521-524 and the inverter circuits 525. A control signal /SCr is provided to a gate electrode of the transistor 526.

Figure 10:
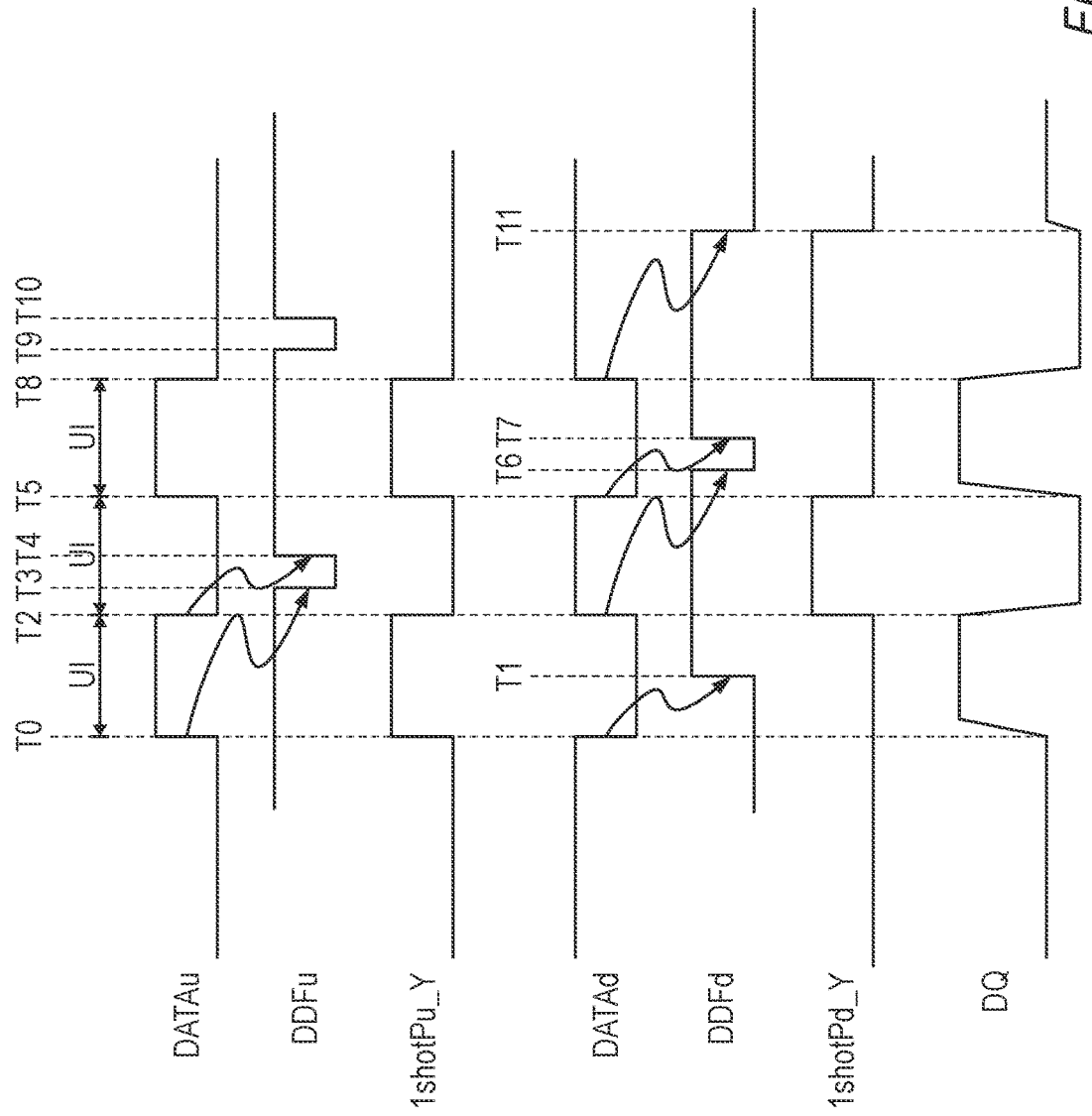
FIG. 10 is a timing diagram of various signals during operation of the pre-emphasis timing control circuit and logic circuits of FIG. 9.

Operation of the pre-emphasis timing control circuit 520 and the logic circuits 130 and 140 is shown in FIG. 10. FIG. 10 is a timing diagram of various signals during operation of the pre-emphasis timing control circuit 520 and the logic circuits 130 and 140. FIG. 10 illustrates pull-up and pull-down data activation signals DATAu and DATAd for three unit intervals (e.g., three bits of data, 1, 0, and 1), timing control signals DDFu and DDFd, and pre-emphasis control signals 1shotPu_Y and 1shotPd_Y (where Y is Hs for the high speed data path and Y is Ls for the low speed data path). In the example of FIG. 10, the control signal /SCr is a high logic level to provide power to the NAND gate circuits 521-524 and the inverter 525. Additionally, the control signals /RSr*Hs and /SCr*Hs are a high logic level to activate the logic circuit 130 for the high-speed speed path or the control signals /RSr*/Hs and/SCr*/Hs are a high logic level to activate the logic circuit 140 for the low-speed path.

The timing control signal DDFu may be provided by a first pre-emphasis timing control circuit 520 that receives the pull-up data activation signal DATAu and pre-emphasis enable signal PEmpEnPu (not shown), and the pre-emphasis control signal 1shotPu_Y is provided by logic circuit 130 and/or 140 that receives the timing control signal DDFu and the pull-up data activation signal DATAu. The timing control signal DDFd may be provided by a second pre-emphasis timing control circuit 520 that receives the pull-down data activation signal DATAd and pre-emphasis enable signal PEmpEnPd (not shown), and the pre-emphasis control signal 1shotPd_Y is provided by logic circuit 130 and/or 140 that receives the timing control signal DDFd and the pull-down data activation signal DATAd.

At time T0, the pull-up data activation signal DATAu changes to a high logic level, causing the pre-emphasis control signal 1shotPu_Y to change to a high logic level and the output data signal DQ to change to a high logic level. High logic level pre-emphasis is activated and the high logic level of the output data signal DQ is driven to a pre-emphasis high logic voltage (e.g., a pumped high voltage). Also at time T0, the pull-down data activation signal DATAd changes to a low logic level, which propagates through the NAND logic circuits 523 and 524, and the inverter circuit 525 of the second pre-emphasis timing control circuit 520 to provide a high logic level timing control signal DDFd at time T1.

At time T2, the pull-up data activation signal DATAu changes to a low logic level, causing the pre-emphasis control signal 1shotPu_Y to change to a low logic level, deactivating the high logic level pre-emphasis. Also at time T2, the pull-down data activation signal DATAd changes to a high logic level. As a result, the pre-emphasis control signal 1shotPd_Y changes to a high logic level to activate low logic level pre-emphasis, and the output data signal DQ changes to a low logic level with pre-emphasis by being driven to a pre-emphasis low logic voltage (e.g., a pumped low voltage).

At time T3, the timing control signal DDFu changes to a low logic level resulting from the rising edge of the pull-up data activation signal DATAu from time T0 having propagated through the NAND logic circuits 521-524 and the inverter circuit 525 of the first pre-emphasis timing control circuit 520. In effect, the rising transition of the pull-up data activation signal at time T0 is delayed to be provided at time T3 as a falling transition of the timing control signal DDFu. The delay provided to the pull-up data activation signal by the pre-emphasis timing control circuit 520 is greater than one UI.

At time T4, the timing control signal DDFu changes to a high logic level resulting from the falling edge of the pull-up data activation signal DATAu from time T2 having propagated through the NAND logic circuits 523 and 524, and the inverter circuit 525 of the second pre-emphasis timing control circuit 520. In effect, the falling transition of the pull-up data activation signal at time T2 is delayed to be provided at time T4 as a rising transition of the timing control signal DDFu. The delay provided to the pull-up data activation signal by the pre-emphasis timing control circuit 520 is less than for a rising transition of the pull-up data activation signal DATAu (e.g., delay between times T0 and T3). As a result of the delays for the rising and falling transitions of the pull-up data activation signal DATAu, pre-emphasis may be provided longer than one UI if the data is the same over two or more UIs (e.g., DATAu remains the same for more than one UI), but the pre-emphasis is disabled at one UI if the data changes after one UI.

At time T5, the pull-up data activation signal DATAu changes to a high logic level. As a result, the pre-emphasis control signal 1shotPu_Y changes to a high logic level and the output data signal DQ changes to a high logic level with pre-emphasis. With the pre-emphasis control signal 1shotPu_Y at a high logic level, high logic level pre-emphasis is applied and the high logic level of the output data signal DQ is driven to a pre-emphasis high logic voltage (e.g., a high pumped voltage). Also at time T5, the pull-down data activation signal DATAd changes to a low logic level. As a result, the pre-emphasis control signal 1shotPd_Y changes to a low logic level, which causes the low logic level pre-emphasis to no longer be applied.

At time T6, the timing control signal DDFd changes to a low logic level resulting from the rising edge of the pull-down data activation signal DATAd from time T2 having propagated through the NAND logic circuits 521-524 and the inverter circuit 525 of the second pre-emphasis timing control circuit 520. In effect, the rising transition of the pull-down data activation signal at time T2 is delayed to be provided at time T6 as a falling transition of the timing control signal DDFd. The delay provided to the pull-up data activation signal by the pre-emphasis timing control circuit 520 is greater than one UI.

At time T7, the timing control signal DDFd changes to a high logic level resulting from the falling edge of the pull-up data activation signal DATAd from time T5 having propagated through the NAND logic circuits 523 and 524, and the inverter circuit 525 of the second pre-emphasis timing control circuit 520. In effect, the falling transition of the pull-down data activation signal at time T5 is delayed to be provided at time T7 as a rising transition of the timing control signal DDFd. The delay provided to the pull-down data activation signal by the pre-emphasis timing control circuit 520 is less than for a rising transition of the pull-down data activation signal DATAd (e.g., delay between times T2 and T6). As a result of the delays for the rising and falling transitions of the pull-down data activation signal DATAd, pre-emphasis may be provided longer than one UI if the data is the same over two or more UIs (e.g., DATAd remains the same for more than one UI), but the pre-emphasis is disabled at one UI if the data changes after one UI.

The logic level transitions at times T8-T10 of the pull-up data activation signal DATAu, timing control signal DDFu, the pre-emphasis control signal 1shotPu_Y, and output data signal DQ are similar to the logic level transitions of the same signals at times T2-T4, as previously described. Similarly, the logic level transitions of the pull-down data activation signal DATAd, timing control signal DDFd, and the pre-emphasis control signal 1shotPd_Y at times T8-T10 are similar to the logic level transitions of the same signals at times T2-T4.

Additionally, at time T11, the timing control signal DDFd changes to a low logic level resulting from the rising edge of the pull-down data activation signal DATAd from time T8 having propagated through the NAND logic circuits 521-524 and the inverter circuit 525 of the second pre-emphasis timing control circuit 520. The low logic level timing control signal DDFd causes the pre-emphasis control signal 1shotPd_Y to change to a low logic level, which causes the low logic level pre-emphasis to no longer be applied.

The pre-emphasis timing control circuit 520 can control the pre-emphasis timing to perform pre-emphasis for longer than one UI if same data continues for two or more UI (e.g., DATAX remains the same for more than one UI). However, if the data changes after one UI or changes to high impedance, the pre-emphasis is stopped at one UI. Thus, pre-emphasis may be provided for more than one UI when the data does not change for two or more UI, but may be provided for one UI if the data changes after one UI.

The pre-emphasis timing control circuit 520 may introduce jitter in the output data signal DQ, however. The jitter may be caused by shifting of a cross point of the output data signal DQ as it transitions between high and low logic voltages. The cross point represents a voltage level between a high logic level voltage and a low logic level voltage of the output data signal DQ where a high-to-low transition intersects a low-to-high of the output data signal DQ. The cross point may preferably be at a voltage level half-way between the high and low logic level voltages. With pre-emphasis, the high and low logic voltages of the output data signal DQ may be either the pre-emphasis logic level voltage or the nominal logic level voltage (e.g., without pre-emphasis). The cross point of the output data signal DQ will shift depending on the voltage level from which the output data signal transitions, that is, either from the higher pre-emphasis logic level voltage or the lower nominal logic level voltage. The jitter may cause the data eyes of the output data signal DQ to be smaller, which can limit performance.

Figure 11:
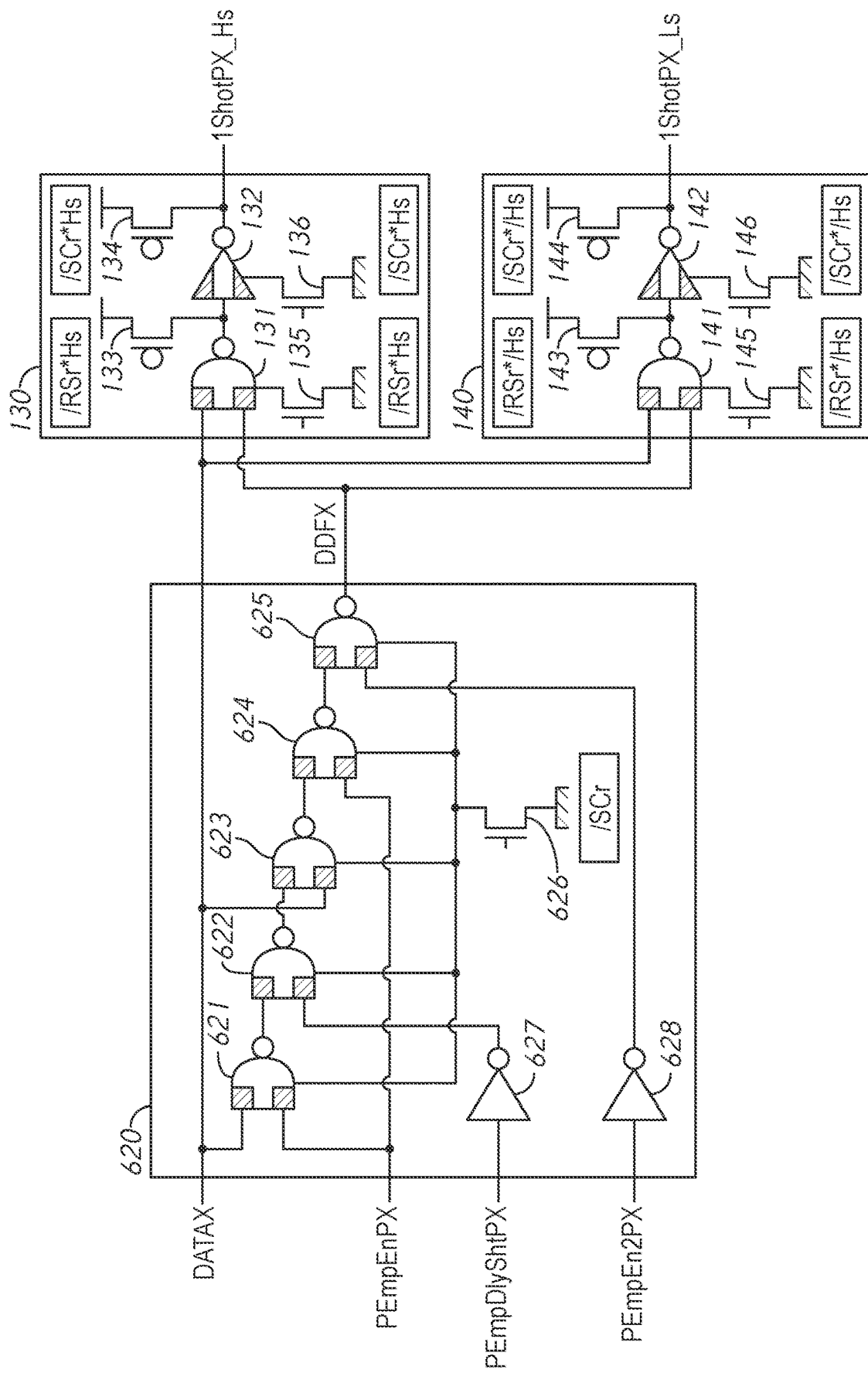
FIG. 11 is a block diagram of a pre-emphasis timing control circuit according to an embodiment of the disclosure and logic circuits.

FIG. 11 is a block diagram of a pre-emphasis timing control circuit 620 according to an embodiment of the disclosure, and logic circuits 130 and 140. The pre-emphasis timing control circuit 620 may be used for controlling the timing of providing pre-emphasis by a pre-emphasis circuit. The logic circuits 130 and 140 provide respective pre-emphasis control signals 1shotPX_Hs and 1shotPX_Ls having a timing as controlled by the pre-emphasis timing control circuit 620. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data. In some embodiments of the disclosure, the pre-emphasis timing control circuit 620 may be included in the pre-emphasis timing control circuit 220 and/or 420. The logic circuit 130 may be included in the logic circuits 230 and/or 430, and the logic circuit 140 may be included in the logic circuits 260 and/or 460. In some embodiments of the disclosure, the pre-emphasis timing control circuit 620 may be included in the pre-emphasis circuits 23 and/or 24.

The pre-emphasis timing control circuit 620 includes NAND gate circuits 621-625. Several signals are provided to the pre-emphasis timing control circuit 620: a data activation signal DATAX, a pre-emphasis enable signal PEmpEnPX, and control signals PEmpDlyShtPX and PEmpEn2PX. The NAND gate circuit 621 receives the data activation signal DATAX and the pre-emphasis enable signal PEmpEnPX and provides an output signal to a first input of the NAND gate circuit 622. The NAND gate 622 also receives a complement of the control signal PEmpDlyShtPX at a second input. The complement of the control signal PEmpDlyShtPX is provided by an inverter 627 that receives the control signal PEmpDlyShtPX. The NAND gate circuit 623 receives the data activation signal DATAX and an output signal of the NAND gate circuit 622, and provides an output signal to the NAND gate 624, which also receives the pre-emphasis enable signal PEmpEnPX. The NAND gate circuit 624 provides an output signal to the NAND gate circuit 625, which also receives a complement of the control signal PEmpEn2PX at a second input, and provides the timing control signal DDFX. The complement of the control signal PEmpEn2PX is provided by an inverter 628 that receives the control signal PEmpEn2PX. An N-channel MOS transistor 626 provides power to the NAND gate circuits 621-625. A control signal /SCr is provided to a gate electrode of the transistor 626. In some embodiments of the disclosure, because the gate circuits are of the same kind, the pre-emphasis timing control circuit 620 may be less likely to cause jitter.

Operation of the pre-emphasis timing control circuit 620 and the logic circuits 130 and 140 will be described with reference to FIGS. 12-15.

Figure 12:
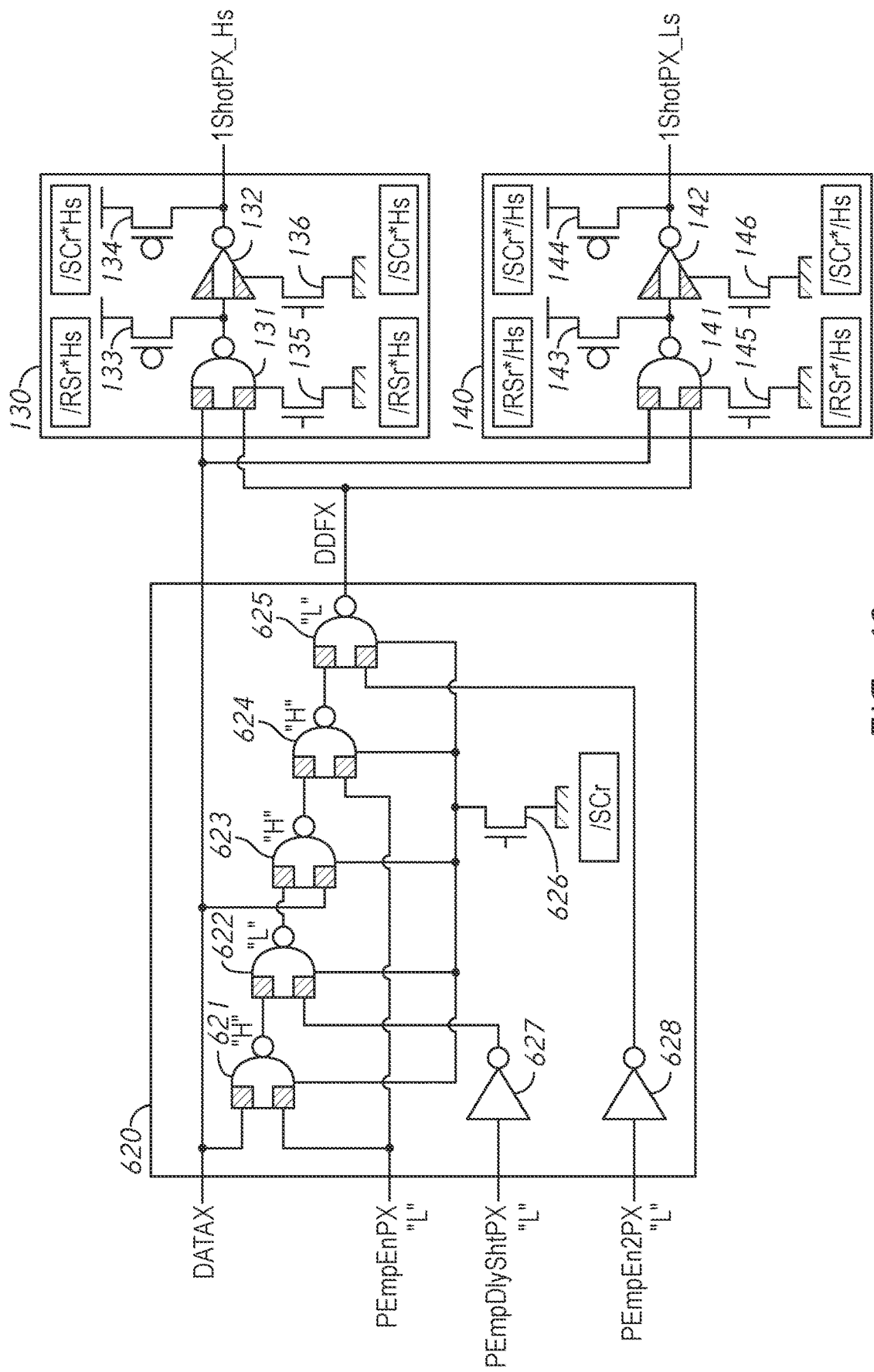
FIG. 12 is a block diagram of the pre-emphasis timing control circuit and logic circuits of FIG. 11 for a mode of operation according to an embodiment of the disclosure.

FIG. 12 is a block diagram of the pre-emphasis timing control circuit 620 with the pre-emphasis enable signal PEmpEnPX, and control signals PEmpDlyShtPX and PEmpEn2PX in a combination of states for a mode of operation according to an embodiment of the disclosure. In the example of FIG. 12, the pre-emphasis enable signal PEmpEnPX, and control signals PEmpDlyShtPX and PEmpEn2PX are set to a low logic level ("L"). As a result, during the mode of operation of FIG. 12, the output of the gate circuit 625 provides a low logic level ("L") timing control signal DDFX and the pre-emphasis function is disabled. The outputs of NAND gate circuits 621-625 are fixed, and do not change regardless of any changing logic level of the data activation signal DATAX. Consequently, there is no current (power) consumption by the pre-emphasis timing control circuit 620 in this mode of operation.

Figure 13:
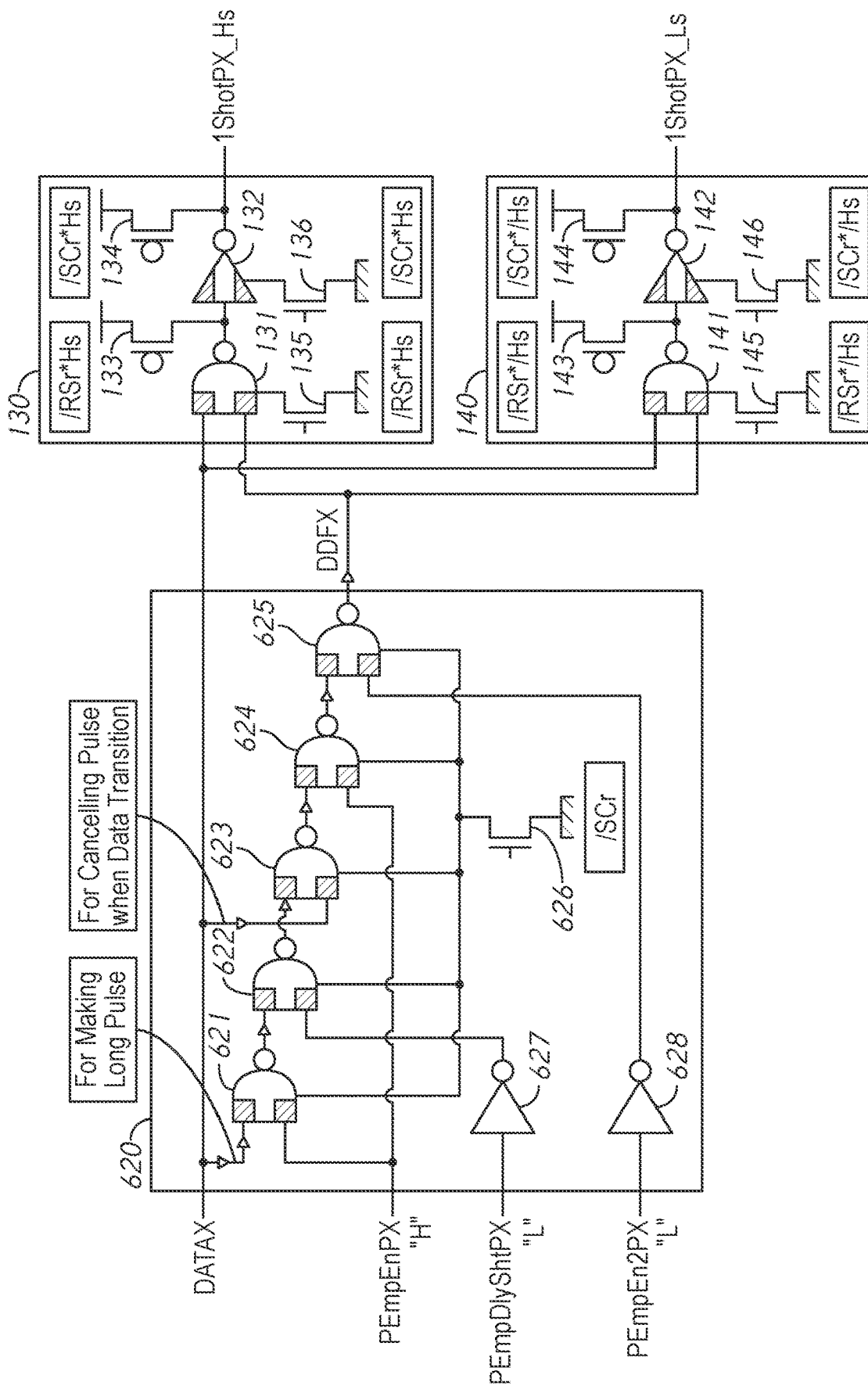
FIG. 13 is a block diagram of the pre-emphasis timing control circuit and logic circuits of FIG. 11 for a mode of operation according to an embodiment of the disclosure.

FIG. 13 is a block diagram of the pre-emphasis timing control circuit 620 with the pre-emphasis enable signal PEmpEnPX, and control signals PEmpDlyShtPX and PEmpEn2PX in a combination of states for a mode of operation according to an embodiment of the disclosure. In the example of FIG. 13, the pre-emphasis enable signal PEmpEnPX is set to a high logic level ("H") to enable the pre-emphasis function, and control signals PEmpDlyShtPX and PEmpEn2PX are set to a low logic level ("L"). When the NAND gate circuit 621 receives the data activation signal DATAX at a high logic level ("H") and the data activation signal DATAX remains at the "H" level for more than 1 UI, the pre-emphasis timing control circuit 620 provides the timing control signal DDFX as a one-shot pulse activated by a change in logic level of the data activation signal DATAX that has a pulse width set by the propagation delay of the NAND gate circuits 621-625 (e.g., pulse width greater than 1 UI). When the data activation signal DATAX changes to a low logic level ("L"), the timing control signal DDFX switches to a low logic level. In effect, the one-shot pulse is canceled due to the transition of the data activation signal DATAX to a low logic level. As a result, during the mode of operation of FIG. 13, the timing control signal DDFX provided by the pre-emphasis timing control circuit 620 activates the pre-emphasis operation to be longer than 1 UI when the data activation signal DATAX remains the same logic level for more than 1 UI, and deactivates the pre-emphasis at 1 UI when the logic level of the data activation signal DATAX changes at 1 UI. As illustrated by the present example, when the pre-emphasis enable signal PEmpEnPX is set to a high logic level ("H"), and control signals PEmpDlyShtPX and PEmpEn2PX are set to a low logic level ("L"), the pre-emphasis timing control circuit 620 provides a timing control signal DDFX similar to the pre-emphasis timing control circuit 520 of FIG. 9.

Figure 14:
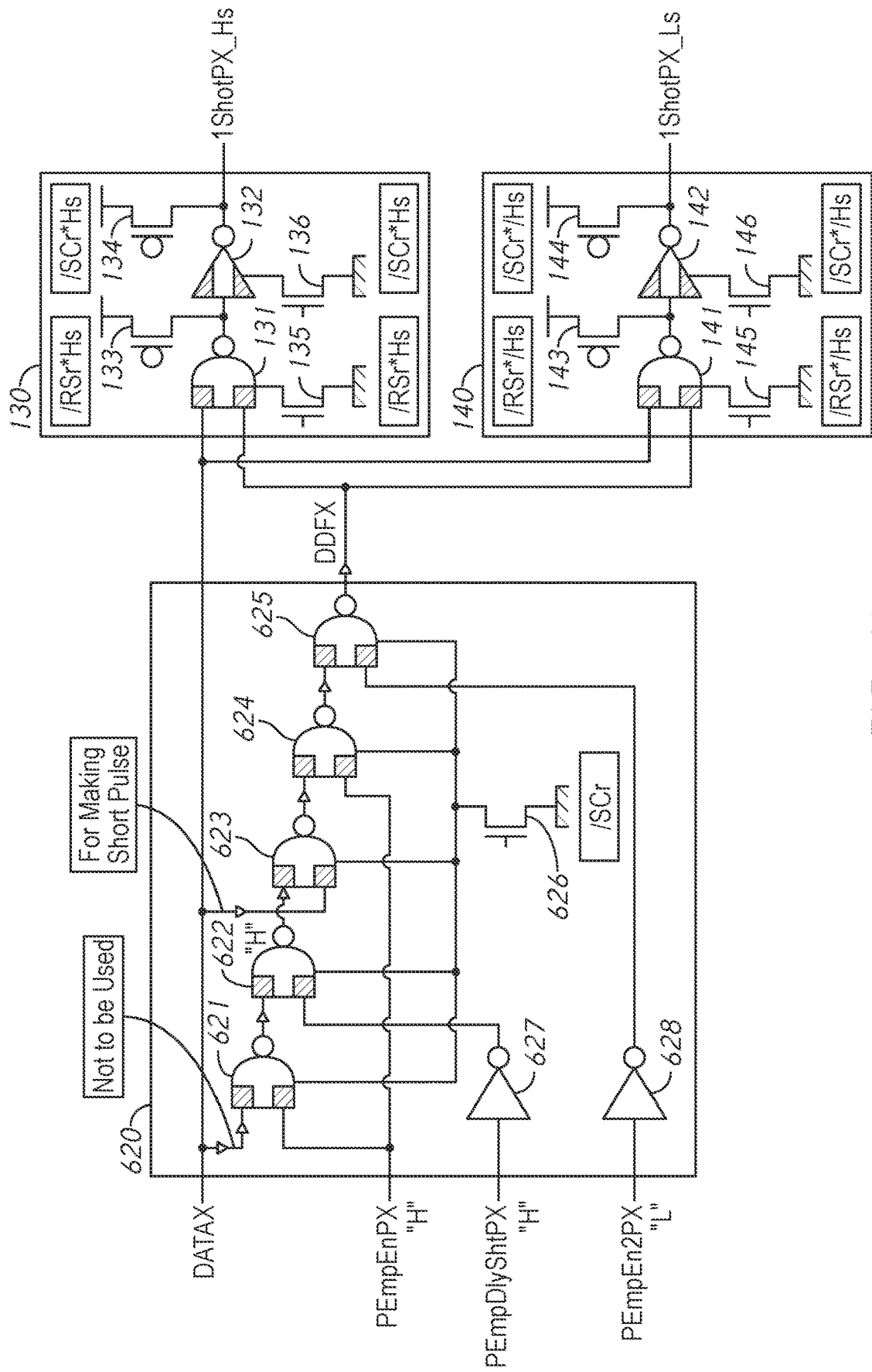
FIG. 14 is a block diagram of the pre-emphasis timing control circuit and logic circuits of FIG. 11 for a mode of operation according to an embodiment of the disclosure.

FIG. 14 is a block diagram of the pre-emphasis timing control circuit 620 with the pre-emphasis enable signal PEmpEnPX, and control signals PEmpDlyShtPX and PEmpEn2PX in a combination of states for a mode of operation according to an embodiment of the disclosure. In the example of FIG. 14, the pre-emphasis enable signal PEmpEnPX is set to a high logic level ("H") to enable the pre-emphasis function, and control signal PEmpDlyShtPX is set to a high logic level ("H") and the control signal PEmpEn2PX is set to a low logic level ("L"). The timing control signal DDFX provided by the pre-emphasis timing control circuit 620 activates the pre-emphasis operation for less than 1 UI. For example, with the control signal PEmpDlyShtPX at a high logic level ("H"), the path for the data activation signal DATAX from the NAND gate circuit 621 is blocked by the NAND gate circuit 622. However, the data activation signal DATAX is provided to the NAND gate circuit 623 and propagates through the NAND gate circuits 624 and 625. As a result, during the mode of operation of FIG. 14, the pre-emphasis timing control circuit 620 provides the timing control signal DDFX as a one-shot pulse activated by a change in logic level of the data activation signal DATAX that has a pulse width set by the propagation delay of the NAND gate circuits 623-625. The propagation delay of the NAND gate circuits 623-625 may be less than 1 UI, to activate pre-emphasis for less than 1 UI. The mode of operation shown in FIG. 14 may be used, for example, high speed operations.

Figure 15:
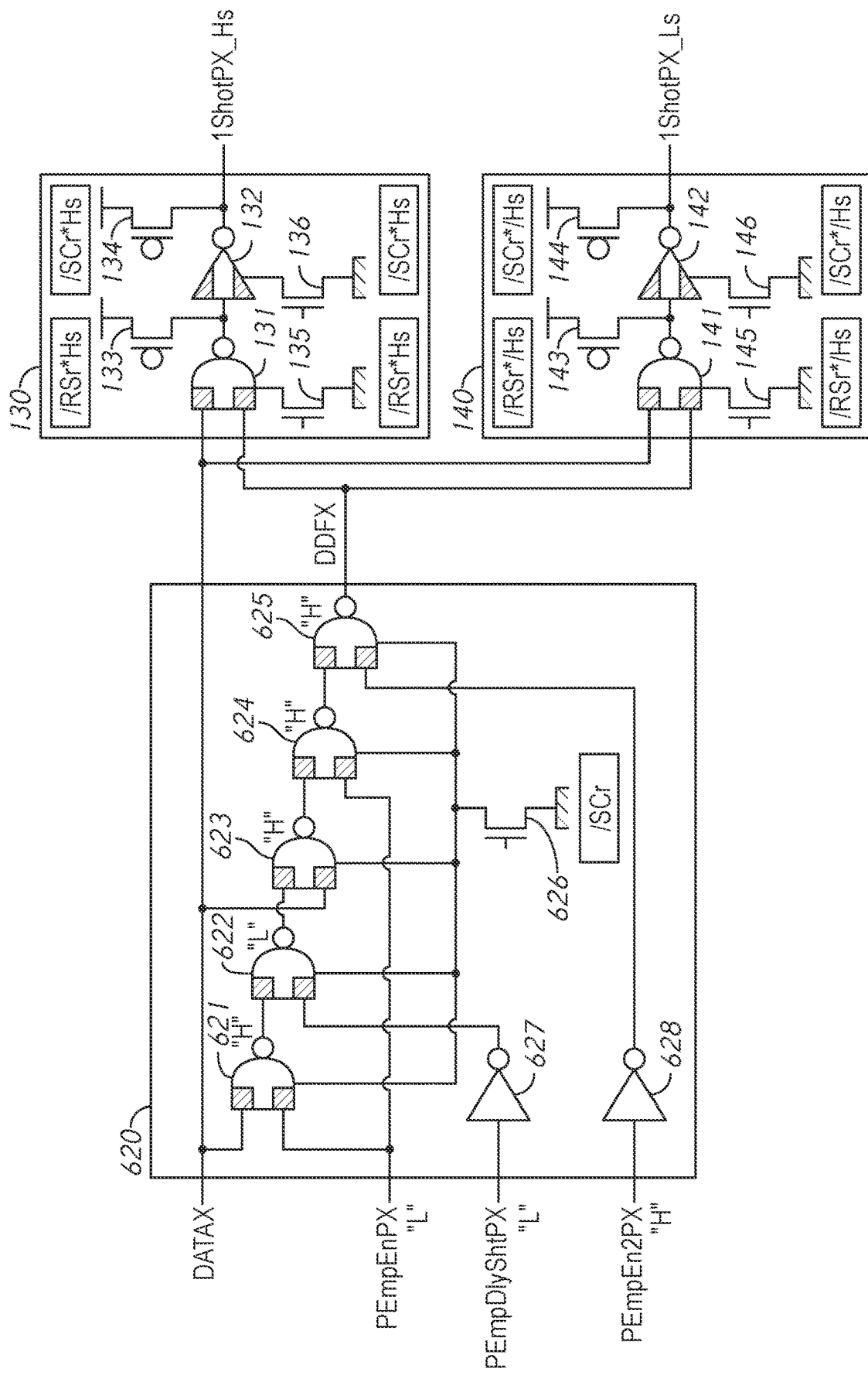
FIG. 15 is a block diagram of the pre-emphasis timing control circuit and logic circuits of FIG. 11 for a mode of operation according to an embodiment of the disclosure.

FIG. 15 is a block diagram of the pre-emphasis timing control circuit 620 with the pre-emphasis enable signal PEmpEnPX, and control signals PEmpDlyShtPX and PEmpEn2PX in a combination of states for a mode of operation according to an embodiment of the disclosure. In the example of FIG. 15, with the pre-emphasis enable signal PEmpEnPX and control signals PEmpDlyShtPX are set to a low logic level ("L"), and the control signal PEmpEn2PX is set to a high logic level ("H"), the pre-emphasis function is enabled. The timing control signal DDFX provided by the pre-emphasis timing control circuit 620 continuously activates the pre-emphasis operation. For example, with the only the control signal PEmpEn2PX at the "H" level, the timing control signal DDFX provided by the NAND gate circuit 625 is a constant high logic level. All of the intermediate nodes at outputs of the NAND gate circuits 623 and 624 are all fixed, and consequently, there is no current (power) consumption. As a result, during the mode of operation of FIG. 15, the output data signal DQ provided has a pre-emphasis high logic voltage for a high logic level and a pre-emphasis low logic voltage for a low logic level.

FIGS. 16A-16C show "data eyes" for output data signals DQ that are provided for different modes of operation according to some embodiments of the disclosure.

FIG. 16A shows the data eyes for output data signals DQ provided for the mode of operation described with reference to FIG. 14. That is, pre-emphasis is enabled, and pre-emphasis may be applied for less than 1 UI. During this mode of operation, the output data signals DQ are provided at pre-emphasis high and low logic voltages during pre-emphasis, and return to nominal high and low logic voltages following pre-emphasis and before the end of 1 UI. As a result, the cross point for the output data signals DQ is relatively stable. However, in this mode of operation, for a relatively shorter 1 UI the duration of pre-emphasis may be insufficient.

FIG. 16B shows the data eyes for output data signals DQ provided for the mode of operation described with reference to FIG. 13. That is, pre-emphasis is enabled, and pre-emphasis may be applied for longer than 1 UI when the data activation signal DATAX remains the same for more than 1 UI, but the pre-emphasis is deactivated at 1 UI when the data activation signal DATAX changes at 1 UI. During this mode of operation, the output data signals DQ are provided at pre-emphasis high and low logic voltages during pre-emphasis, which may exceed 1 UI in some conditions, and return to nominal high and low logic voltages following pre-emphasis, which may be after 1 UI, or transition at 1 UI from one pre-emphasis level to the other pre-emphasis level (e.g., from pre-emphasis high level to pre-emphasis low level or from pre-emphasis low level to pre-emphasis high level) depending on the state of the data activation signal DATAX. As a result, pre-emphasis may be sufficient even for conditions having relatively shorter 1 UI. However, in this mode of operation, as previously described jitter may be introduced in the output data signal DQ due to the shifting of the cross point of the output data signal DQ as it transitions between high and low logic voltages.

FIG. 16C shows the data eyes for output data signals DQ provided for the mode of operation described with reference to FIG. 15. That is, pre-emphasis is enabled, and pre-emphasis may be applied continuously. During this mode of operation, the output data signals DQ are provided at pre-emphasis high and low logic voltages continuously. As a result, the cross point for the output data signals DQ is relatively stable. Additionally, output impedance does not change as it does when the output data signals DQ change between the pre-emphasis high and low logic level voltages and the nominal high and low logic level voltages. However, the relatively higher pre-emphasis high and low logic level voltages will increase current consumption, which may be undesirable.

As previously described, the different modes of operation previously described for the timing control circuit 620 may be selected by the pre-emphasis enable signal PEmpEnPX, and control signals PEmpDlyShtPX and PEmpEn2PX. As illustrated by FIG. 16A-16C, the different modes of operation for pre-emphasis may have different advantages and disadvantages. The different modes of operation may be selected to tailor performance to different operating conditions and configurations.

For example, consider a configuration including a memory semiconductor device (e.g., semiconductor device 10 of FIG. 1) and a System on Chip (SoC) included in a Package on Package (PoP) where the memory device and SoC are bonded together relatively closely. The mode of pre-emphasis operation described with reference to FIGS. 15 and 16C (e.g., "always" mode) may provide a largest data eye (e.g., most desirable) for the output data signals DQ provided between the memory device and the SoC. The mode of pre-emphasis operation described with reference to FIGS. 14 and 16A (e.g., "short" mode) may provide the next largest data eye for the output data signals DQ, and the mode of pre-emphasis operation described with reference to FIGS. 13 and 16B (e.g., "long" mode) may provide the smallest data eye (e.g., least desirable) for the output data signals DQ of the three modes of pre-emphasis operation.

In contrast, however, consider a configuration including a memory semiconductor device and an SoC included on a Printed Circuit Board (PCB) where the memory device and SoC are apart from each other and the data transmission path is relatively long. The mode of pre-emphasis operation described with reference to FIGS. 13 and 16B (e.g., "long" mode) may provide a largest data eye (e.g., most desirable) for the output data signals DQ provided between the memory device and the SoC. The mode of pre-emphasis operation described with reference to FIGS. 14 and 16A (e.g., "short" mode) may provide the next largest data eye for the output data signals DQ, and the mode of pre-emphasis operation described with reference to FIGS. 15 and 16C (e.g., "always" mode) may provide the smallest data eye (e.g., least desirable) for the output data signals DQ of the three modes of pre-emphasis operation.

Yet in another type of configuration, there may be the case that the mode of pre-emphasis operation described with reference to FIGS. 14 and 16A (e.g., "short" mode) may provide a largest data eye (e.g., most desirable) for the output data signals DQ provided between the memory device and the SoC. Thus, different modes of pre-emphasis operation may work best for different configurations and transmission paths. Thus, providing user selectable modes of pre-emphasis operation may provide flexibility to accommodate different systems and configurations.

Figure 17:
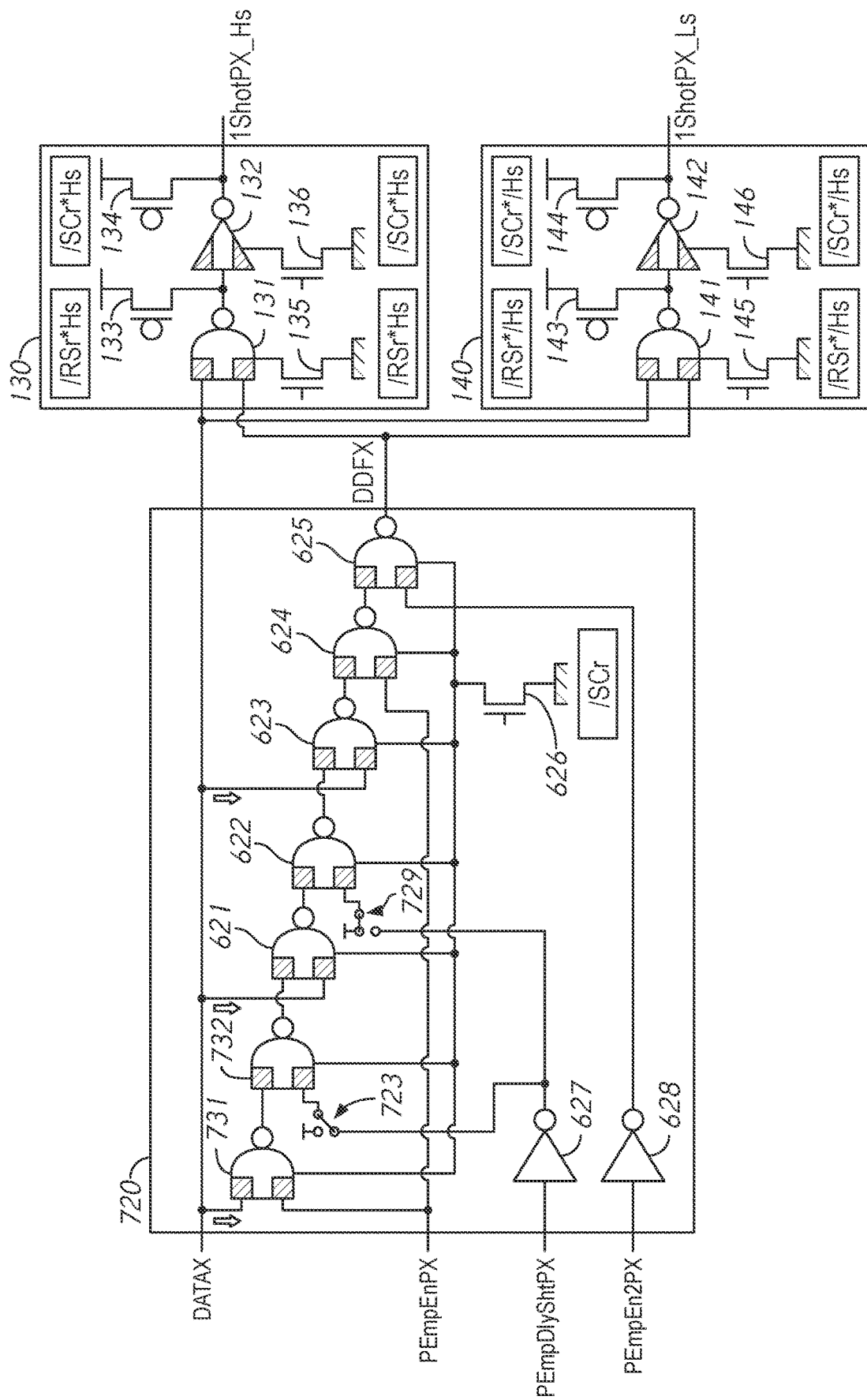
FIG. 17 is a block diagram of a pre-emphasis timing control circuit according to an embodiment of the disclosure and logic circuits.

FIG. 17 is a block diagram of a pre-emphasis timing control circuit 720 according to an embodiment of the disclosure, and logic circuits 130 and 140. The pre-emphasis timing control circuit 720 may be used for controlling the timing of providing pre-emphasis by a pre-emphasis circuit. The logic circuits 130 and 140 provide respective pre-emphasis control signals 1shotPX_Hs and 1shotPX_Ls having a timing as controlled by the pre-emphasis timing control circuit 720. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data. In some embodiments of the disclosure, the pre-emphasis timing control circuit 720 may be included in the pre-emphasis timing control circuit 220 and/or 420. The logic circuit 130 may be included in the logic circuits 230 and/or 430, and the logic circuit 140 may be included in the logic circuits 260 and/or 460. In some embodiments of the disclosure, the pre-emphasis timing control circuit 720 may be included in the pre-emphasis circuits 23 and/or 24.

The pre-emphasis timing control circuit 720 is similar to the pre-emphasis timing control circuit 620 of FIG. 11. In comparison to the pre-emphasis timing control circuit 620, the pre-emphasis timing control circuit 720 further includes NAND gate circuits 731 and 732, and switches 723 and 729. The NAND gate circuit 731 receives the data activation signal DATAX and the pre-emphasis enable signal PEmpEnPX, and provides an output signal to a first input of the NAND gate circuit 732. The switch 723 may be set to provide to a second input of the NAND gate circuit 732 a high logic level voltage or the complement of the control signal PEmpDlyShtPX. The NAND gate circuit 732 provides an output signal to a first input of the NAND gate circuit 621. The NAND gate circuit 621 further receives at a second input the data activation signal DATAX, and provides an output signal to a first input of NAND gate circuit 622. The switch 729 may be set to provide a second input of the NAND gate circuit 622 a high logic level voltage or the complement of the control signal PEmpDlyShtPX. In some embodiments of the disclosure, the switches 723 and 729 may be set by setting a fuse or antifuse, for example, during manufacture of a semiconductor device. In some embodiments of the disclosure, the switches 723 and 729 may be set through programming, for example, programming the settings for the switches 723 and 729 in a mode register included in a semiconductor device.

Operation of the pre-emphasis timing control circuit 720 is similar to operation of the pre-emphasis timing control circuit 620. However, the NAND gate circuits 731 and 732, and the switches 723 and 729 may be used to optionally extend the timing of the timing control signal DDFX (e.g., by the propagation delay of two NAND gate circuits) that is provided by the pre-emphasis timing control circuit 720 to activate the pre-emphasis operation for an extended time. For example, setting the switch 723 to provide the complement of the control signal PEmpDlyShtPX to the second input of the NAND gate circuit 732 and setting the switch 729 to provide the high logic level voltage to the second input of the NAND gate circuit 622 configures the pre-emphasis timing control circuit 720 to provide an extended timing control signal DDFX for the mode of operation previously described with reference to FIG. 13 (e.g., to provide pre-emphasis for more than 1 UI) and for the mode of operation previously described with reference to FIG. 14 (e.g., to provide pre-emphasis for less than 1 UI). Extending the time of the pre-emphasis operation may provide flexibility to accommodate 1 UI of different lengths of time. When the switch 723 is set to provide the high logic level voltage to the second input of the NAND gate circuit 732 and the switch 729 is set to provide the complement of the control signal PEmpDlyShtPX to the second input of the NAND gate circuit 622, the pre-emphasis timing control circuit 720 is configured to provide the timing control signal DDFX having the timing as previously described with reference to the pre-emphasis timing control circuit 620 of FIG. 11.

Figure 18:
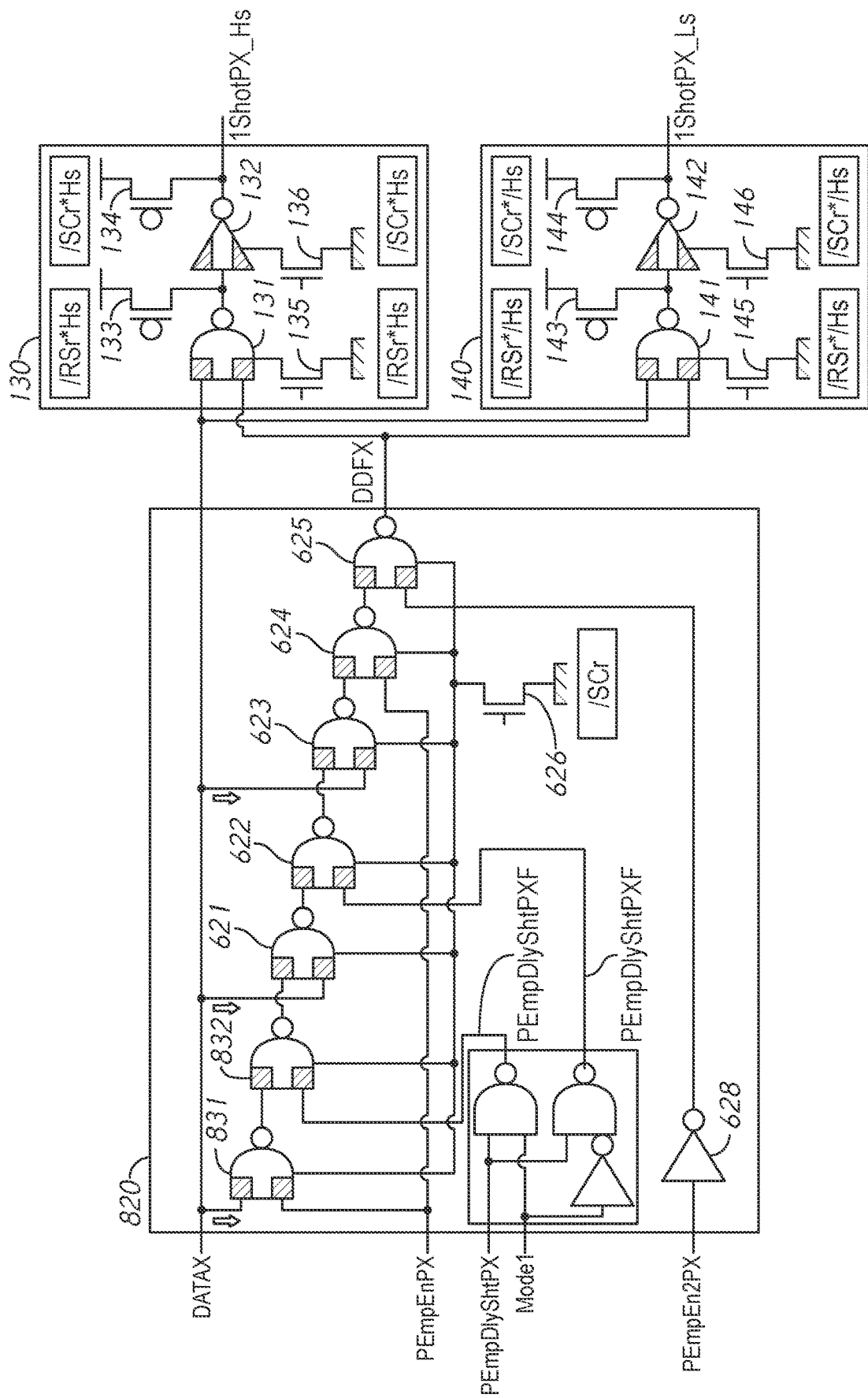
FIG. 18 is a block diagram of a pre-emphasis timing control circuit according to an embodiment of the disclosure and logic circuits.

FIG. 18 is a block diagram of a pre-emphasis timing control circuit 820 according to an embodiment of the disclosure, and logic circuits 130 and 140. The pre-emphasis timing control circuit 820 may be used for controlling the timing of providing pre-emphasis by a pre-emphasis circuit. The logic circuits 130 and 140 provide respective pre-emphasis control signals 1shotPX_Hs and 1shotPX_Ls having a timing as controlled by the pre-emphasis timing control circuit 820. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data. In some embodiments of the disclosure, the pre-emphasis timing control circuit 820 may be included in the pre-emphasis timing control circuit 220 and/or 420. The logic circuit 130 may be included in the logic circuits 230 and/or 430, and the logic circuit 140 may be included in the logic circuits 260 and/or 460. In some embodiments of the disclosure, the pre-emphasis timing control circuit 820 may be included in the pre-emphasis circuits 23 and/or 24.

The pre-emphasis timing control circuit 820 is similar to the pre-emphasis timing control circuit 620 of FIG. 11. In comparison to the pre-emphasis timing control circuit 620, the pre-emphasis timing control circuit 820 further includes NAND gate circuits 831 and 832, and control logic 840. The NAND gate circuit 831 receives the data activation signal DATAX and the pre-emphasis enable signal PEmpEnPX, and provides an output signal to a first input of the NAND gate circuit 832. The control logic 840 receives the control signal PEmpDlyShtPX and a control signal Model, and provides a control signal PEmpDlyShtPXF (the complement of the control signal PEmpDlyShtPX) to a second input of the NAND gate circuit 832 or to a second input of NAND gate circuit 622 based on the control signal Model. For example, when the control signal Model is at a high logic level, the control logic 840 provides the control signal PEmpDlyShtPXF to the second input of the NAND gate circuit 832 and provides a high logic level to the second input of the NAND gate circuit 622. Conversely, when the control signal Model is at a low logic level, the control logic 840 provides the control signal PEmpDlyShtPXF to the second input of the NAND gate circuit 622 and provides a high logic level to the second input of the NAND gate circuit 832. In some embodiments of the disclosure, the control signal Model may be set by setting a fuse or antifuse, for example, during manufacture of a semiconductor device. In some embodiments of the disclosure, the control signal Model may be set through programming, for example, programming the settings for the control signal Model in a mode register included in a semiconductor device.

Operation of the pre-emphasis timing control circuit 820 is similar to operation of the pre-emphasis timing control circuit 620. However, the NAND gate circuits 831 and 832, and the control logic 840 may be used to optionally extend the timing of the timing control signal DDFX (e.g., by the propagation delay of two NAND gate circuits) that is provided by the pre-emphasis timing control circuit 820 to activate the pre-emphasis operation for an extended time. For example, when the control signal Model has a high logic level (and the complement of the control signal PEmpDlyShtPX is provided to the second input of the NAND gate circuit 832), the pre-emphasis timing control circuit 820 is configured to provide an extended timing control signal DDFX for the mode of operation previously described with reference to FIG. 13 (e.g., to provide pre-emphasis for more than 1 UI) and for the mode of operation previously described with reference to FIG. 14 (e.g., to provide pre-emphasis for less than 1 UI). Extending the time of the pre-emphasis operation may provide flexibility to accommodate 1 UI of different lengths of time. However, when the control signal Model has a low logic level (and the complement of the control signal PEmpDlyShtPX is provided to the second input of the NAND gate circuit 622), the pre-emphasis timing control circuit 820 is configured to provide the timing control signal DDFX having the timing as previously described with reference to the pre-emphasis timing control circuit 620 of FIG. 11.

As previously described, in some embodiments of the disclosure control signals and enable signals (e.g., PEmpEnPX, PEmpDlyShtPX, PEmpEn2PX, Model) may be used to enable pre-emphasis operation and select different modes of pre-emphasis operation. In some embodiments of the disclosure, a mode of operation for a pre-emphasis timing control circuit according to an embodiment of the disclosure (e.g., pre-emphasis timing control circuit 620, 720, and/or 820) may be set by programming information in a mode register of a semiconductor device including the pre-emphasis timing control circuit. For example, a mode register write (MRW) operation may be used to program the information into the mode register to set the mode of operation for the pre-emphasis timing control circuit. The mode of operation for the pre-emphasis timing control circuit may be changed by programming new information into the mode register to set another mode of operation.

In some embodiments, a mode register may include sets of registers that may be programmed with different information to set modes of operation for the pre-emphasis timing control circuit for different frequency set points (FSPs). The mode of operation may be changed by selecting which of the sets of registers to use to set the mode of operation. For example, a first set of registers may be programmed with information for a first mode of operation to be used with a first clock frequency and/or first system configuration, and a second set of registers may be programmed with information for a second mode of operation to be used with a second clock frequency and/or a second system configuration. During operation with the first clock frequency and/or in a first system configuration, the first set of registers may be selected to set a first mode of operation. When the clock switches to the second clock frequency and/or the system configuration is changed to a second system configuration, the second set of registers may be selected to set a second mode of operation. In this manner, the mode of operation may be switched between different modes of operation by switching between different frequency set points.

FIG. 19A is a diagram of example settings for different modes of operation of a pre-emphasis timing control circuit for different frequency set points for a mode register according to an embodiment of the disclosure. In some embodiments of the disclosure, the example settings of FIG. 19A may be used for a system configuration including a memory semiconductor device (e.g., semiconductor device 10 of FIG. 1) and a System on Chip (SoC) included in a Package on Package (PoP) where the memory device and SoC are bonded together relatively closely. FIG. 19A shows the settings for three different frequency set points: FSP[0] for a relatively low operating clock frequency, FSP[1] for an intermediate high operating clock frequency, and FSP[2] for a higher operating clock frequency. The settings of one of the frequency set points may be selected to set the mode of operation for a pre-emphasis timing control circuit. The pre-emphasis "Off" setting of FSP[0] and FSP[1] may correspond to the pre-emphasis function being disabled (e.g., as described with reference to FIG. 12 for the pre-emphasis timing control circuit 620 of FIG. 11). The pre-emphasis "Always" setting of FSP[2] may correspond to the mode of operation where the pre-emphasis function is continuously activated (e.g., as described with reference to FIG. 15 for the pre-emphasis timing control circuit 620 of FIG. 11). FIG. 19A further shows an effect on the cross point for the output data signal DQ for a corresponding mode of pre-emphasis operation. For FSP[0], for example, the cross point for the output data signal DQ may shift downward, whereas for FSP[1] and FSP[2] the cross point may not be meaningfully affected and remain at a default level.

FIG. 19B is a diagram of example settings for different modes of operation of a pre-emphasis timing control circuit for different frequency set points for a mode register according to an embodiment of the disclosure. In some embodiments of the disclosure, the example settings of FIG. 19B may be used for a system configuration including a memory semiconductor device and an SoC included on a Printed Circuit Board (PCB) where the memory device and SoC are apart from each other and the data transmission path is relatively long. FIG. 19B shows the settings for three different frequency set points: FSP[0] for a relatively low operating clock frequency, FSP[1] for an intermediate high operating clock frequency, and FSP[2] for a higher operating clock frequency. The settings of one of the frequency set points may be selected to set the mode of operation for the pre-emphasis timing control circuit. The pre-emphasis "Off" setting of FSP[0] and FSP[1] may correspond to the pre-emphasis function being disabled (e.g., as described with reference to FIG. 12 for the pre-emphasis timing control circuit 620 of FIG. 11). The pre-emphasis "Long" setting of FSP[2] may correspond to the mode of operation where the pre-emphasis function is activated for more than 1 UI when the data remains the same for more than 1 UI, and deactivated at 1 UI when the data changes at 1 UI (e.g., as described with reference to FIG. 13 for the pre-emphasis timing control circuit 620 of FIG. 11). FIG. 19B further shows an effect on the cross point for the output data signal DQ for a corresponding mode of pre-emphasis operation. For FSP[0] and FSP[2], for example, the cross point for the output data signal DQ may shift downward, whereas for FSP[1] the cross point may not be meaningfully affected and remain at a default level.

In some modes of operation for a pre-emphasis timing control circuit according to an embodiment of the disclosure (e.g., pre-emphasis timing control circuit 620, 720, and/or 820), a cross point of a resulting output data signal DQ may shift upward or downward from a preferred level (e.g., at a preferred voltage level at the midpoint between a high logic voltage level and a low logic voltage level). For example, in a mode of operation where the pre-emphasis function is activated for more than 1 UI when the data remains the same for more than 1 UI, and deactivated at 1 UI when the data changes at 1 UI, the cross point for the output data signal DQ may shift upward relative to a default (e.g., nominal) level. In another example, in a mode of operation where the pre-emphasis function is disabled, such as when a clock frequency is relatively low and no termination is used, the cross point for the output data signal DQ may shift upward relative to the default level. A shift in cross point from a default level may negatively affect a data eye for the output data signal DQ, such as shrinking the data eye.

Figure 20A:
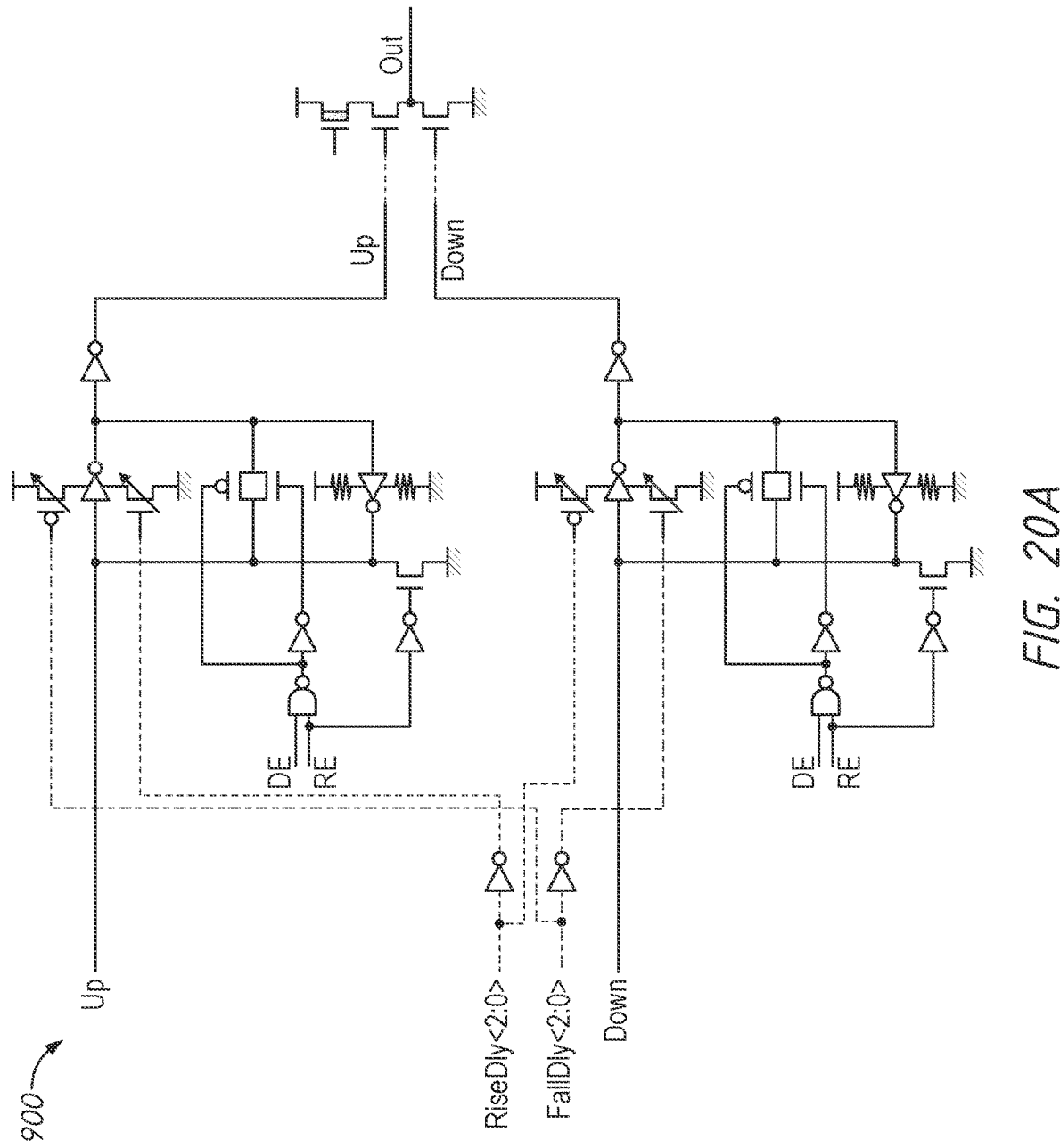
FIG. 20A is a circuit diagram for a signal path for driving an output buffer circuit according to an embodiment of the disclosure.

FIG. 20A is a circuit diagram for a signal path 900 for driving an output buffer circuit according to an embodiment of the disclosure. The signal path 900 is divided into a pull-up signal path and a pull-down signal path. The pull-up signal path receives a pull-up signal Up (e.g., from a parallel/serial conversion circuit), a complement of code signal RiseDly, code signal FallDly, a read enable signal RE, and a de-emphasis enable signal DE. The pull-down signal path receives a pull down signal Down (e.g., from a parallel/serial conversion circuit), the code signal RiseDly, a complement of the code signal FallDly, a read enable signal RE, and a de-emphasis enable signal DE. The code signals RiseDly and FallDly are shown in FIG. 20A as each including three bits. However, in other examples, the codes signals RiseDly and FallDly may include a greater or fewer number of bits. The read enable signal RE is active during read data operations, and the de-emphasis enable signal DE is active to enable de-emphasis operations.

The signal path 900 may be used to adjust the cross point of an output data signal Out to compensate for undesirable shifting of the cross point. For example, the code signals RiseDly and FallDly may be used to adjust a cross point of the output data signal Out signal by selectively delaying the rising and/or falling edges of the output data signal.

Figure 20B:
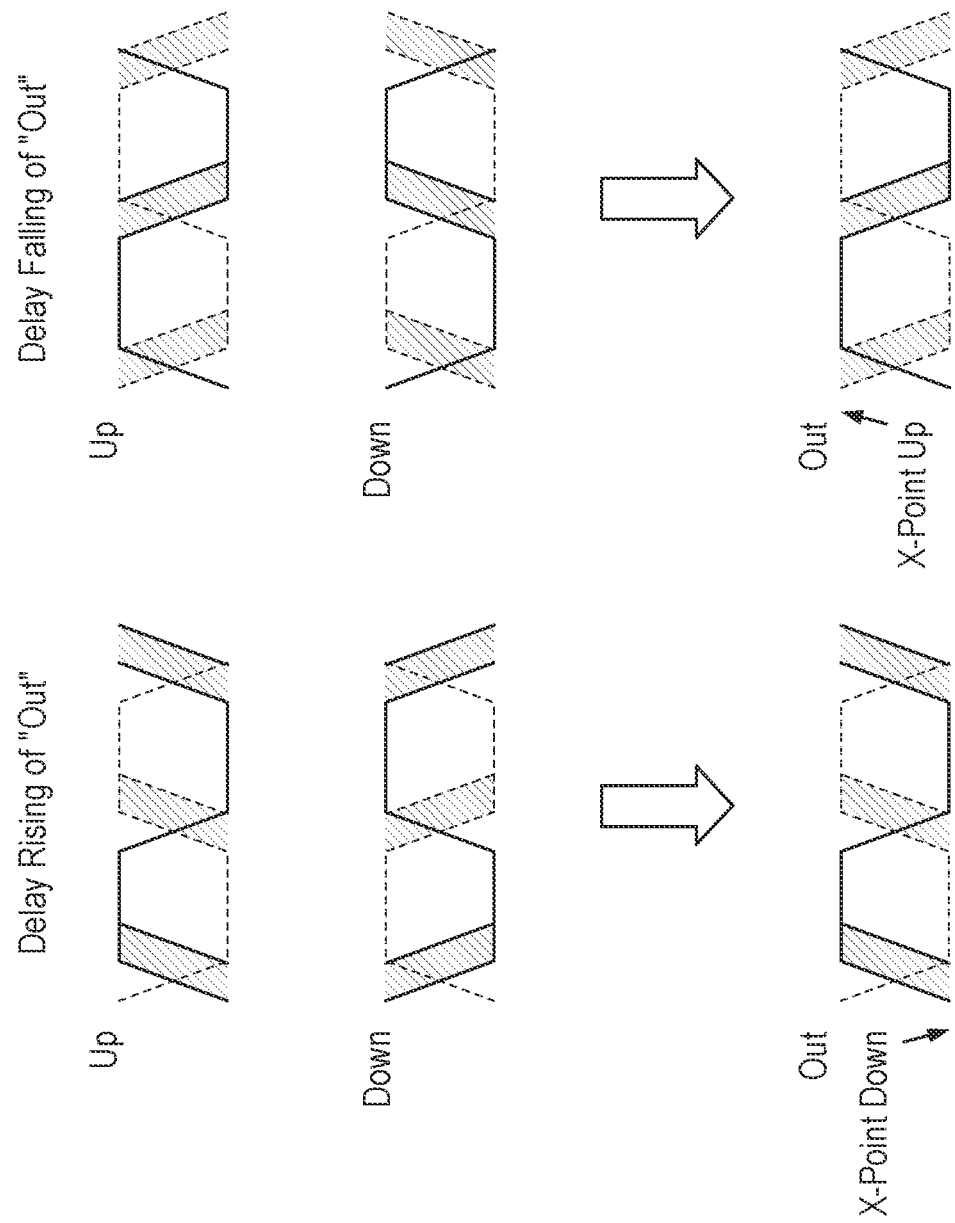
FIG. 20B are diagrams of various signals during operation of the signal path of FIG. 20A according to an embodiment of the disclosure.

Example operation of the signal path 900 to adjust the cross point of output data signal Out will be described with reference to FIG. 20B. FIG. 20B are diagrams of various signals during operation of the signal path 900 according to an embodiment of the disclosure.

With reference to FIG. 20B in the left signal diagrams, incrementing the code signal RiseDly causes the pull-up signal path to delay rising edges of the pull-up signal and causes the pull-down signal path to delay falling edges of the pull-down signal. In turn, the delayed rising edges of the pull-up signal and the delayed falling edges of the pull-down signal cause the output buffer circuit to provide an output data signal Out having delayed rising edges as shown in the left signal diagrams of FIG. 20B. As a result of delaying the rising edges of the output data signal Out, the cross point of the output data signal may shift downward as also shown in the left signal diagrams of FIG. 20B.

With reference to FIG. 20B in the right signal diagrams, incrementing the code signal FallDly causes the pull-up signal path to delay falling edges of the pull-up signal and causes the pull-down signal path to delay rising edges of the pull-down signal. In turn, the delayed falling edges of the pull-up signal and the delayed rising edges of the pull-down signal cause the output buffer circuit to provide an output data signal Out having delayed falling edges as shown in the right signal diagrams of FIG. 20B. As a result of delaying the falling edges of the output data signal Out, the cross point of the output data signal may shift upward as shown in the right signal diagrams of FIG. 20B.

Using the signal path 900 to control the output buffer circuit to provide an output data signal Out having a downward shift may compensate for undesirable upward shifting of the output data signal Out. Conversely, using the signal path 900 control the output buffer circuit to provide an output data signal Out having an upward shift may compensate for undesirable downward shifting of the output data signal Out.

Figure 21:
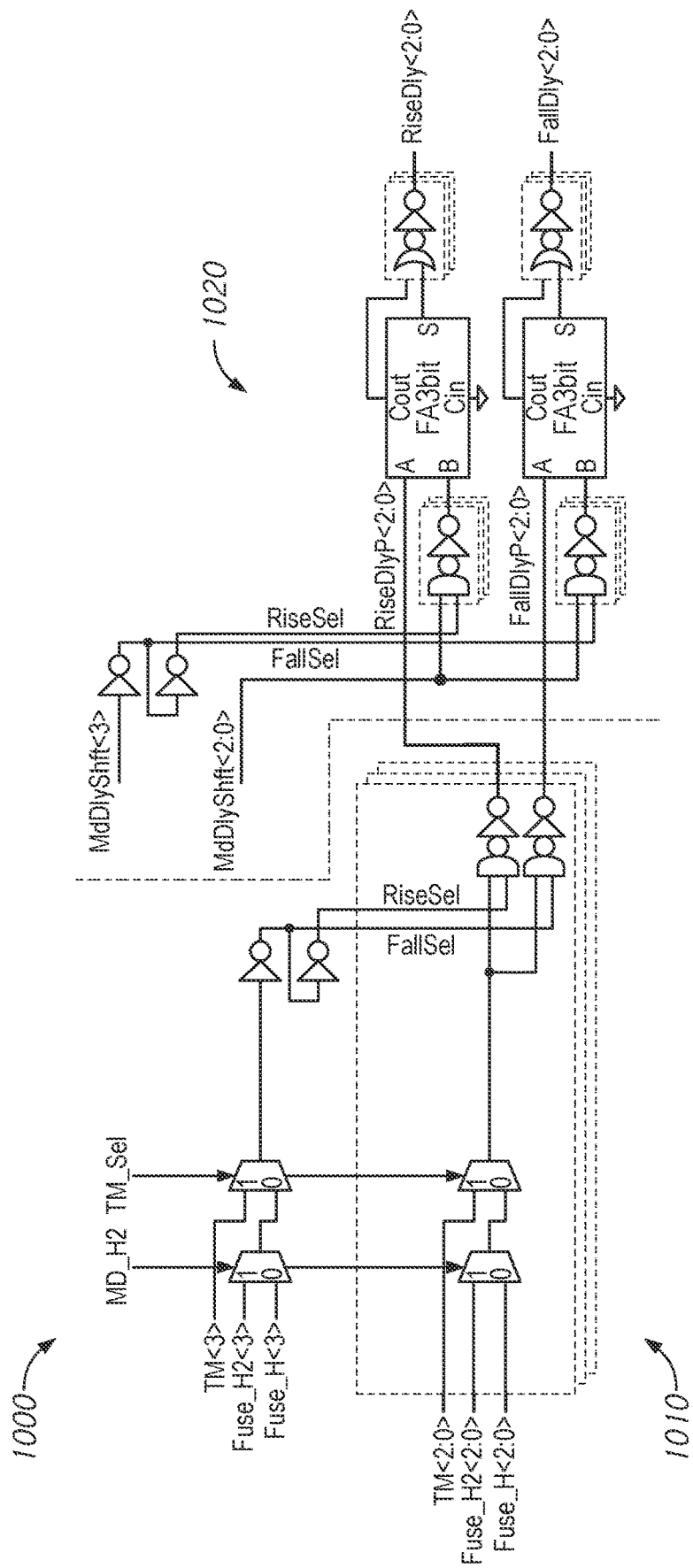
FIG. 21 is a circuit diagram of a signal path control circuit according to an embodiment of the disclosure.

FIG. 21 is a circuit diagram of a signal path control circuit 1000 according to an embodiment of the disclosure. The signal path control circuit 1000 may provide code signals RiseDly and FallDly. In some embodiments of the disclosure, the code signals RiseDly and FallDly may be provided to a signal path, for example, signal path 900 of FIG. 20A.

Base code signals RiseDlyP and FallDlyP are provided by a code signal circuit 1010. The base code signals RiseDlyP and FallDlyP may be based on fuse/antifuse signals (e.g., Fuse_H and Fuse_H2) and trim signals TM and TM_Sel. The fuse/antifuse signals and the trim signals may be set during manufacturing. The base code signals RiseDlyP and FallDlyP are provided to a code signal adjuster circuit 1020. The code signal adjuster circuit may adjust the base code signals RiseDlyP and/or FallDlyP (e.g., incrementing, decrementing) to provide code signals RiseDly and FallDly. Control signals MdDlyShft are used to control the adjustment of the base code signals RiseDlyP and/or FallDlyP. For example, a portion of the control signals MdDlyShft (e.g., MdDlyShft<3>) may be used to select which of the base code signals RiseDlyP and/or FallDlyP to adjust, and another portion of the control signals MdDlyShft (e.g., MdDlyShft<2:0>) may be used to control the type of adjustment (e.g., increment, decrement) of base code signals RiseDlyP and/or FallDlyP to provide the code signals RiseDly and FallDly. In some embodiments of the disclosure, a code signal circuit 1010 and a corresponding code signal adjuster circuit 1020 may be included for each signal path associated with a respective output data signal Out. In some embodiments, some or all of the code signal circuits 1010 and corresponding code signal adjuster circuits 1020 may be shared and/or combined to provide code signals RiseDly and FallDly.

As previously described with reference to the signal path 900, the code signals RiseDly and FallDly may be used to control the signal path to cause the output buffer circuit to provide an output data signal Out having a selectively shifted cross point, which may be used to compensate for undesirable cross point shifting.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a pull-up circuit configured to receive a pull-up data activation signal and drive a data terminal to a pull-up voltage responsive to an active pull-up data activation signal;
a pull-down circuit configured to receive a pull-down activation signal and drive the data terminal to a pull-down voltage responsive to an active pull-down data activation signal; and
a pre-emphasis circuit configured to receive at least one of the pull-up and pull-down data activation signals and configured to further receive control signals to set a mode of operation and provide pre-emphasis responsive to the at least one of the active pull-up and pull-down data activation signals, the pre-emphasis circuit including a pre-emphasis timing control circuit configured to provide a timing control signal based on the at least one of the pull-up and pull-down data activation signals and further including a logic circuit configured to provide a pre-emphasis control signal based on the at least one of the pull-up and pull-down data activation signals and the timing control signal to control providing pre-emphasis having a timing based on the mode of operation set by the control signals, wherein the pre-emphasis timing control circuit is configured to provide in a first mode of operation the timing control signal to control providing pre-emphasis for greater than one unit interval of data when the at least one of the pull-up and pull-down data activation signals remains active for greater than one unit interval and further configured to provide in a second mode of operation the timing control signal to control providing pre-emphasis for less than one unit interval of data when the at least one of the pull-up and pull-down data activation signals is active.

2. The apparatus of claim 1, wherein the logic circuit is further configured to provide in the first mode the pre-emphasis control signal to control providing the pre-emphasis for one unit interval of data when the data activation signal become inactive at one unit interval.

3. The apparatus of claim 1, wherein the logic circuit is further configured to provide in the first mode the pre-emphasis control signal to control providing the pre-emphasis for less than two unit intervals when the data activation signal remains active for two or more unit intervals.

4. The apparatus of claim 1 wherein the pre-emphasis timing control circuit is configured to receive a pre-emphasis enable signal and further configured to be disabled responsive to the pre-emphasis enable signal having a first state and to be enabled responsive to the pre-emphasis enable signal having a second state.

5. The apparatus of claim 1 wherein the pre-emphasis timing control circuit is configured to provide in a first mode of operation the timing control signal to control providing pre-emphasis continuously when the data activation signal is active and further configured to provide in a second mode of operation the timing control signal to control providing pre-emphasis for less than continuously when the data activation signal is active.

6. The apparatus of claim 1, wherein the pre-emphasis circuit comprises a pull-up pre-emphasis circuit configured to receive the pull-up data activation signal, and the apparatus further comprises a pull-down pre-emphasis circuit configured to receive the pull-down data activation signal and to further receive the control signals to set the mode of operation, and provide pull-down pre-emphasis responsive to the active pull-down data activation signal, the pull-down pre-emphasis circuit including a pull-down pre-emphasis timing control circuit configured to provide a pull-down timing control signal based on the pull-down data activation signal and further including a pull-down logic circuit configured to provide a pull-down pre-emphasis control signal to control providing pull-down pre-emphasis having a timing based on the mode of operation set by the control signals.

7. An apparatus comprising:
a pull-up circuit configured to receive a pull-up data activation signal and drive a data terminal to a pull-up voltage responsive to an active pull-up data activation signal;
a pull-down circuit configured to receive a pull-down activation signal and drive the data terminal to a pull-down voltage responsive to an active pull-down data activation signal; and
a pre-emphasis circuit configured to receive at least one of the pull-up and pull-down data activation signals and configured to further receive control signals to set a mode of operation and provide pre-emphasis responsive to the at least one of the active pull-up and pull-down data activation signals, the pre-emphasis circuit including a pre-emphasis timing control circuit configured to provide a timing control signal based on the at least one of the pull-up and pull-down data activation signals and further including a logic circuit configured to provide a pre-emphasis control signal based on the at least one of the pull-up and pull-down data activation signals and the timing control signal to control providing pre-emphasis having a timing based on the mode of operation set by the control signals, wherein the pre-emphasis timing control circuit comprises:
a first NAND gate circuit configured to receive the data activation signal and a pre-emphasis enable signal and to provide a first output signal;
a second NAND gate circuit configured to receive the first output signal and a first control signal and to provide a second output signal;
a third NAND gate circuit configured to receive the second output signal and the data activation signal and to provide a third output signal;
a fourth NAND gate circuit configured to receive the third output signal and the pre-emphasis enable signal and to provide a fourth output signal; and
a fifth NAND gate circuit configured to receive the fourth output signal and a second control signal and provide the timing control signal.

8. An apparatus comprising:
a pull-up circuit configured to receive a pull-up data activation signal and drive a data terminal to a pull-up voltage responsive to an active pull-up data activation signal;
a pull-down circuit configured to receive a pull-down activation signal and drive the data terminal to a pull-down voltage responsive to an active pull-down data activation signal; and
a pre-emphasis circuit configured to receive at least one of the pull-up and pull-down data activation signals and configured to further receive control signals to set a mode of operation and provide pre-emphasis responsive to the at least one of the active pull-up and pull-down data activation signals, the pre-emphasis circuit including a pre-emphasis timing control circuit configured to provide a timing control signal based on the at least one of the pull-up and pull-down data activation signals and further including a logic circuit configured to provide a pre-emphasis control signal based on the at least one of the pull-up and pull-down data activation signals and the timing control signal to control providing pre-emphasis having a timing based on the mode of operation set by the control signals, wherein the pre-emphasis timing control circuit comprises:
a first NAND gate circuit configured to receive the data activation signal and a pre-emphasis enable signal and to provide a first output signal;
a second NAND gate circuit configured to receive the first output signal and to further receive a first control signal or a logic high voltage, and further configured to provide a second output signal;

a third NAND gate circuit configured to receive the data activation signal and the second output signal and to provide a third output signal;

a fourth NAND gate circuit configured to receive the third output signal and to further receive the first control signal or a logic high voltage, and further configured to provide a fourth output signal;

a fifth NAND gate circuit configured to receive the fourth output signal and the data activation signal and to provide a fifth output signal;

a sixth NAND gate circuit configured to receive the fifth output signal and the pre-emphasis enable signal and to provide a sixth output signal; and a seventh NAND gate circuit configured to receive the sixth output signal and a second control signal and provide the timing control signal.

9. An apparatus comprising:

a pull-up circuit configured to receive a pull-up data activation signal and drive a data terminal to a pull-up voltage responsive to an active pull-up data activation signal;

a pull-down circuit configured to receive a pull-down activation signal and drive the data terminal to a pull-down voltage responsive to an active pull-down data activation signal; and a pre-emphasis circuit configured to receive at least one of the pull-up and pull-down data activation signals and configured to further receive control signals to set a mode of operation and provide pre-emphasis responsive to the at least one of the active pull-up and pull-down data activation signals, the pre-emphasis circuit including a pre-emphasis timing control circuit configured to provide a timing control signal based on the at least one of the pull-up and pull-down data activation signals and further including a logic circuit configured to provide a pre-emphasis control signal based on the at least one of the pull-up and pull-down data activation signals and the timing control signal to control providing pre-emphasis having a timing based on the mode of operation set by the control signals, wherein the pre-emphasis timing control circuit comprises:

control logic configured to receive first and second control signals and provide a third control signal based on states of the first and second control signals;

a first NAND gate circuit configured to receive the data activation signal and a pre-emphasis enable signal and to provide a first output signal;

a second NAND gate circuit configured to receive the first output signal and to further receive the third control signal, and further configured to provide a second output signal;

a third NAND gate circuit configured to receive the data activation signal and the second output signal and to provide a third output signal;

a fourth NAND gate circuit configured to receive the third output signal and to further receive the third control signal, and further configured to provide a fourth output signal;

a fifth NAND gate circuit configured to receive the fourth output signal and the data activation signal and to provide a fifth output signal;

a sixth NAND gate circuit configured to receive the fifth output signal and the pre-emphasis enable signal and to provide a sixth output signal; and a seventh NAND gate circuit configured to receive the sixth output signal and a second control signal and provide the timing control signal, wherein the control logic is configured to provide an active third control signal to the second NAND gate circuit responsive to a first combination of states for the first and second control signals and provide the active third control signal to the fourth NAND gate circuit responsive to a second combination of states for the first and second control signals.

10. An apparatus, comprising:

a pull-up circuit configured to receive a pull-up data activation signal and drive a data terminal to a pull-up voltage responsive to an active pull-up data activation signal;

a pull-down circuit configured to receive a pull-down activation signal and drive the data terminal to a pull-down voltage responsive to an active pull-down data activation signal; and a pre-emphasis circuit configured to receive at least one of the pull-up and pull-down data activation signals and to further receive control signals to set a mode of operation, and provide pre-emphasis responsive to the active at least one of the pull-up and pull-down data activation signals, the pre-emphasis circuit including a pre-emphasis timing control circuit configured to provide a timing control signal and further including a logic circuit configured to provide a pre-emphasis control signal based on the at least one of the pull-up and pull-down data activation signals and the timing control signal to control providing pre-emphasis with a first timing responsive to a first mode of operation, with a second timing responsive to a second mode of operation, and a third timing responsive to a third mode of operation, wherein the pre-emphasis timing control circuit is configured to provide in the first mode of operation the timing control signal to control providing pre-emphasis for greater than one unit interval of data when the at least one of the pull-up and pull-down data activation signals remains active for greater than one unit interval, and further provide in the third mode of operation the timing control signal to control providing pre-emphasis continuously when the data activation signal is active.

11. The apparatus of claim 10 wherein in the first mode of operation the pre-emphasis timing control circuit is configured to provide the timing control signal including a first signal transition having a first delay relative to a rising transition of the data activation signal and further configured to provide the timing control signal including a second signal transition having a second delay relative to a falling transition of the data activation signal, wherein the first and second signal transitions are opposite and the second delay is less than the first delay.

12. The apparatus of claim 10 wherein in the second mode of operation the pre-emphasis timing control circuit is configured to provide the timing control signal including a first signal transition having a first delay relative to a rising transition of the data activation signal and further configured to provide the timing control signal including a second signal transition having a second delay relative to a falling transition of the data activation signal, wherein the first and second signal transitions are opposite and the second delay is equal to the first delay.

13. The apparatus of claim 10 wherein the pre-emphasis timing control circuit is configured to include a first option to provide the timing control signal including a first signal transition having a first delay relative to a rising transition of the data activation signal and further configured to include a second option to provide the timing control signal including the first signal transition having a second delay relative to a rising transition of the data activation signal, wherein the second delay is greater than the first delay.

14. The apparatus of claim 13 wherein the pre-emphasis timing control circuit comprises first and second switches configured to be set to select the first option or second option.

15. The apparatus of claim 13 wherein the pre-emphasis timing control circuit comprises control logic configured to receive a control signal and further configured to provide control signals to select the first option or the second option based on a logic state of the control signal.

16. The apparatus of claim 10, wherein the pre-emphasis timing control circuit is further configured to provide in the second mode of operation the timing control signal to control providing pre-emphasis for less than one unit interval of data when the at least one of the pull-up and pull-down data activation signals is active.

17. A method, comprising:
    providing pre-emphasis responsive to an active data activation signal;
    in a first mode of operation:
        responsive to the data activation signal remaining active for more than one unit interval, continuing to provide pre-emphasis for more than one unit interval and less than two unit intervals, and
        responsive to an inactive data activation signal, ceasing pre-emphasis; and
    in a second mode of operation:
        ceasing pre-emphasis within one unit interval.

18. The method of claim 17, further comprising in a third mode of operation continuously providing pre-emphasis while the data activation signal remains active.

19. The method of claim 17, wherein providing the pre-emphasis responsive to an active data activation signal comprises providing pull-up pre-emphasis responsive to an active pull-up data activation signal, and the method further comprises:
    providing pull-down pre-emphasis responsive to an active pull-down activation signal;
    in the first mode of operation:
        responsive to the pull-down activation signal remaining active for more than one unit interval, continuing to provide pull-down pre-emphasis for more than one unit interval and less than two unit intervals, and
        responsive to an inactive pull-down activation signal, ceasing pull-down pre-emphasis; and
    in the second mode of operation:
        ceasing pull-down pre-emphasis within one unit interval.

20. The method of claim 17, shifting a cross point for output data signals in the first mode.

21. The method of claim 20 wherein shifting the cross point for the output data signals comprises:
    delaying rising edges of the output data signal to shift the cross point lower; and
    delaying falling edges of the output data signal to shift the cross point higher.

* * * * *